United States Patent
Sonehara et al.

(10) Patent No.: US 8,907,318 B2
(45) Date of Patent: Dec. 9, 2014

(54) RESISTANCE CHANGE MEMORY

(71) Applicants: Takeshi Sonehara, Kawasaki (JP);
Takayuki Okamura, Machida (JP);
Takashi Shigeoka, Fujisawa (JP);
Masaki Kondo, Kawasaki (JP)

(72) Inventors: Takeshi Sonehara, Kawasaki (JP);
Takayuki Okamura, Machida (JP);
Takashi Shigeoka, Fujisawa (JP);
Masaki Kondo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/665,681

(22) Filed: Oct. 31, 2012

(65) Prior Publication Data

US 2013/0070517 A1 Mar. 21, 2013

Related U.S. Application Data

(63) Continuation of application No. 12/755,891, filed on Apr. 7, 2010, now abandoned.

(30) Foreign Application Priority Data

Jun. 12, 2009 (JP) .................................. 2009-141427

(51) Int. Cl.
*H01L 45/00* (2006.01)
*H01L 29/868* (2006.01)
(Continued)

(52) U.S. Cl.
CPC .......... *G11C 13/003* (2013.01); *G11C 2213/76* (2013.01); *G11C 13/0004* (2013.01); *H01L 27/2409* (2013.01); *B82Y 10/00* (2013.01); *G11C 2213/72* (2013.01); *H01L 45/04* (2013.01); *H01L 27/2418* (2013.01); *G11C 2013/0073* (2013.01); *G11C 13/025* (2013.01); *H01L 45/1233* (2013.01); *H01L 45/06* (2013.01); *G11C 2213/71* (2013.01); *G11C 13/0007* (2013.01); *H01L 27/2481* (2013.01)

USPC ................ 257/5; 257/E45.002; 257/E29.328; 257/E29.336; 365/148; 365/175

(58) Field of Classification Search
CPC .. G11C 11/36; G11C 13/0002; H01L 29/861; H01L 29/868; H01L 45/04
USPC ............ 257/2–5, 43, 183, 200, 201, E45.002, 257/E29.328, E29.336; 365/148, 174, 175
See application file for complete search history.

(56) References Cited

U.S. PATENT DOCUMENTS 6,473,336 B1 10/2002 Nakajima et al.
6,753,561 B1 6/2004 Rinerson et al.
(Continued)

FOREIGN PATENT DOCUMENTS

JP 2001-236781 8/2001
JP 2005-136425 5/2005
(Continued)

OTHER PUBLICATIONS

Japanese Office Action issued May 14, 2013, in Japan Patent Application No. 2009-141427 (with English translation).

*Primary Examiner* — Allison P Bernstein
(74) *Attorney, Agent, or Firm* — Oblon, Spivak, McClelland, Maier & Neustadt, L.L.P.

(57) ABSTRACT

A resistance change memory includes a first conductive line extending in a first direction, a second conductive line extending in a second direction which is crossed to the first direction, a cell unit including a memory element and a rectifying element connected in series between the first and second conductive lines, and a control circuit which is connected to both of the first and second conductive lines. The control circuit controls a voltage to change a resistance of the memory element between first and second values reversibly. The rectifying element is a diode including an anode layer, a cathode layer and an insulating layer therebetween.

10 Claims, 30 Drawing Sheets

(51) Int. Cl.
*G11C 11/00* (2006.01)
*G11C 13/00* (2006.01)
*H01L 27/24* (2006.01)
*B82Y 10/00* (2011.01)
*G11C 13/02* (2006.01)

(56) References Cited

U.S. PATENT DOCUMENTS

| | | |
|---|---|---|
| 6,947,333 B2 | 9/2005 | Smith |
| 7,446,038 B2 | 11/2008 | Jeng |
| 7,764,534 B2 * | 7/2010 | Thorp et al. ............... 365/148 |
| 7,889,537 B2 | 2/2011 | Edahiro et al. |
| 2006/0268594 A1 | 11/2006 | Toda |
| 2008/0272363 A1 * | 11/2008 | Mouli ........................ 257/14 |
| 2008/0308783 A1 | 12/2008 | Ahn et al. |
| 2009/0121208 A1 | 5/2009 | Nagashima et al. |
| 2010/0078758 A1 | 4/2010 | Sekar et al. |
| 2011/0210303 A1 | 9/2011 | Muraoka et al. |
| 2011/0260131 A1 | 10/2011 | Sonehara |
| 2012/0025160 A1 | 2/2012 | Sonehara |

FOREIGN PATENT DOCUMENTS

| | | |
|---|---|---|
| JP | 2007-165873 | 6/2007 |
| JP | 2007-311772 | 11/2007 |
| JP | 2008-282499 | 11/2008 |
| JP | 2008-311663 | 12/2008 |
| JP | 2009-130139 | 6/2009 |
| WO | WO 2008/062688 A1 | 5/2008 |
| WO | WO 2009/098734 A1 | 8/2009 |
| WO | WO 2010/026625 A1 | 3/2010 |

* cited by examiner

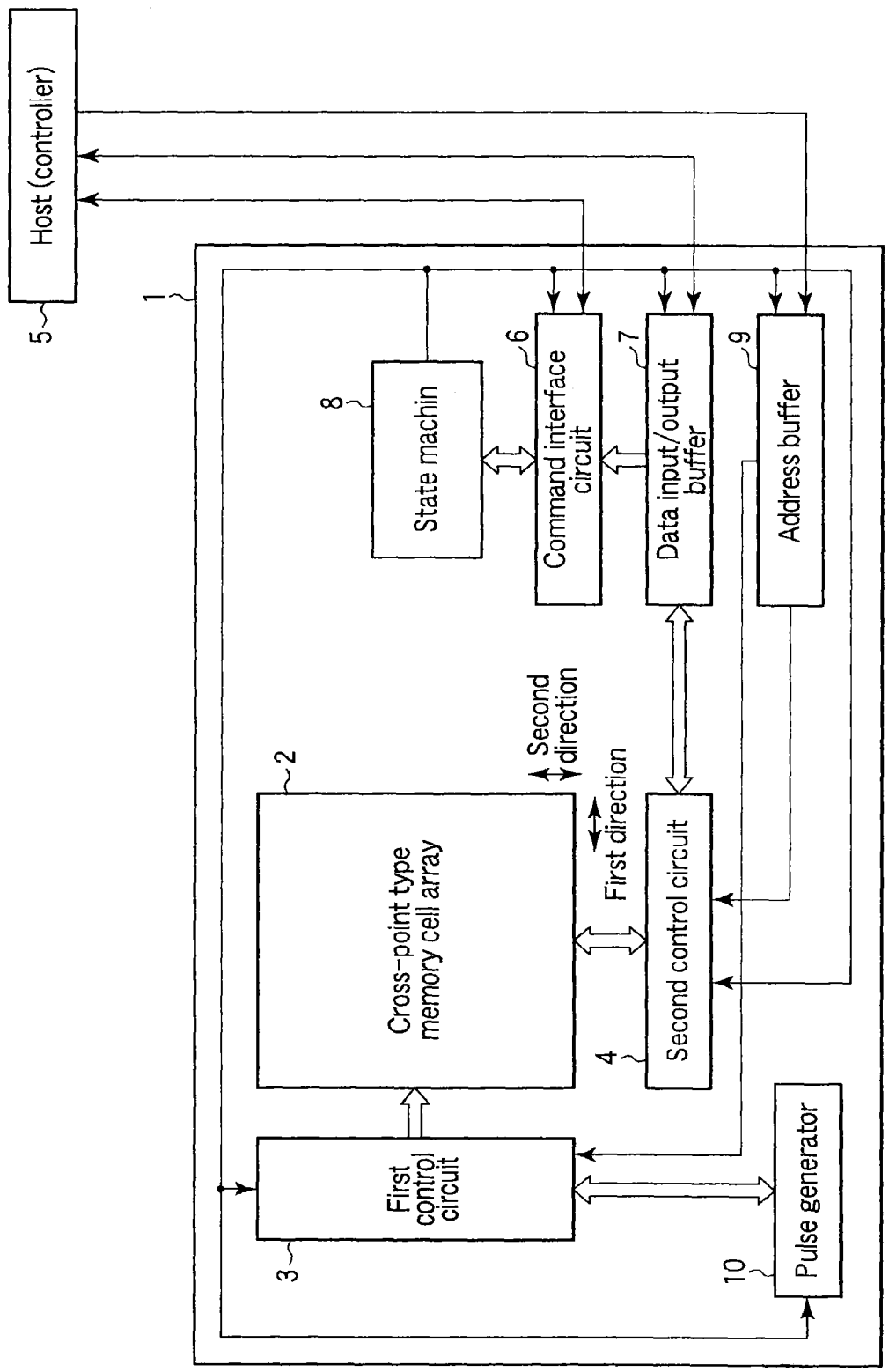
F I G. 1

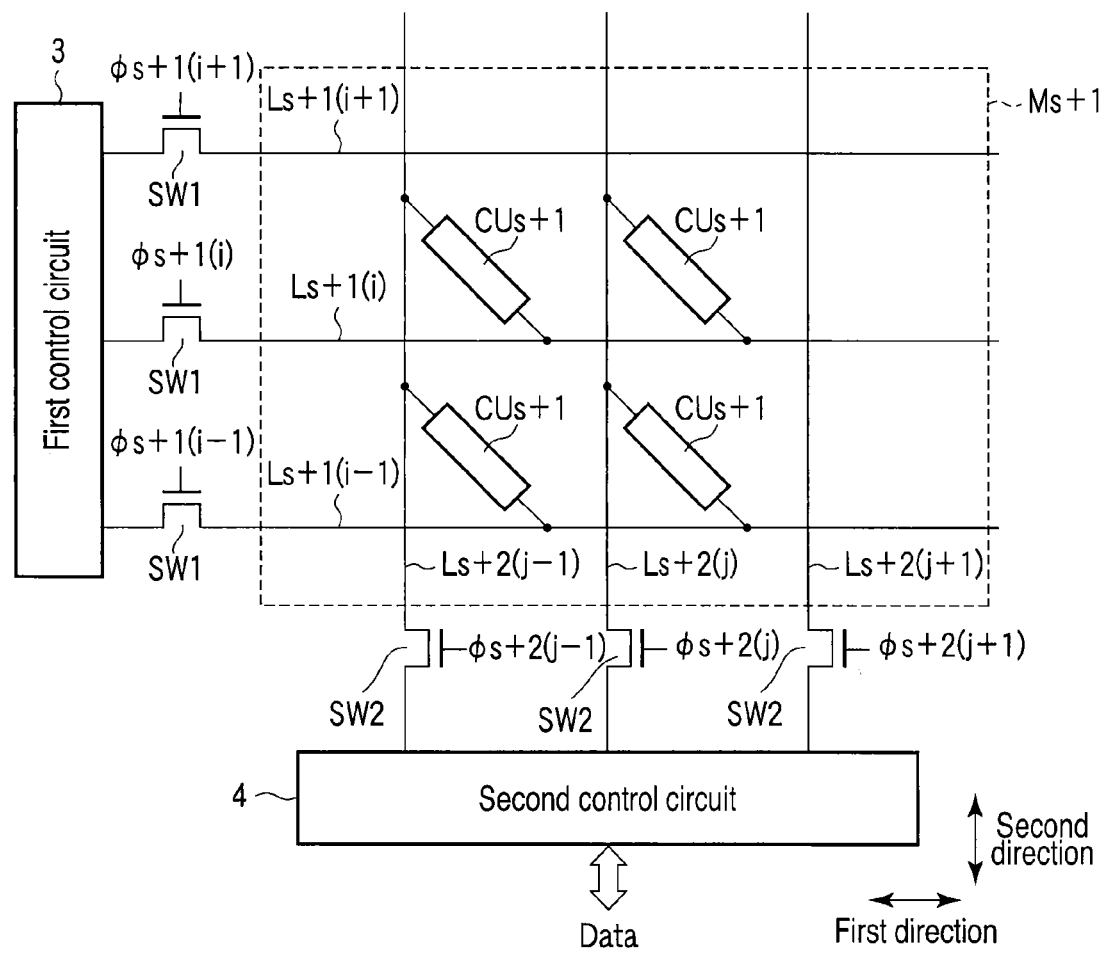
F I G. 7

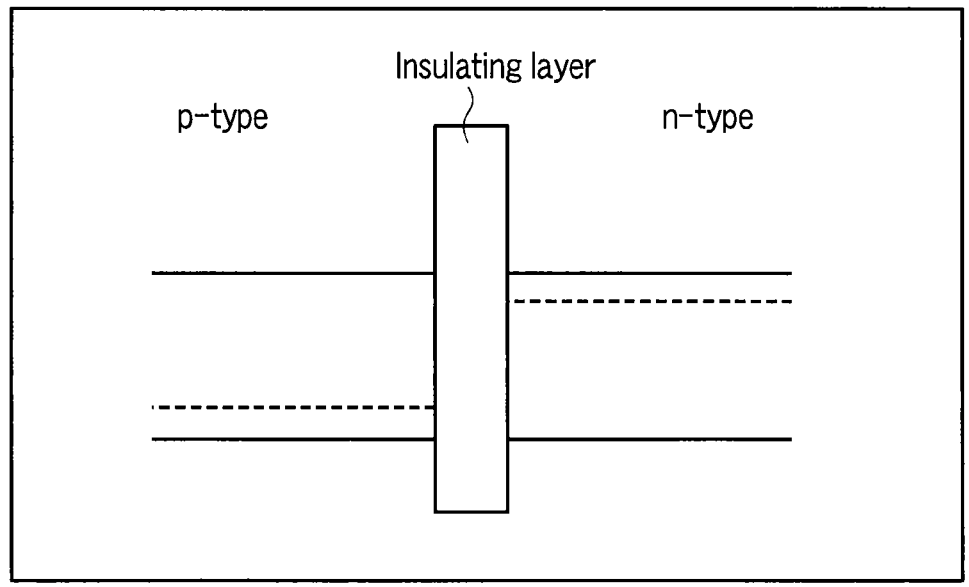
F I G. 12
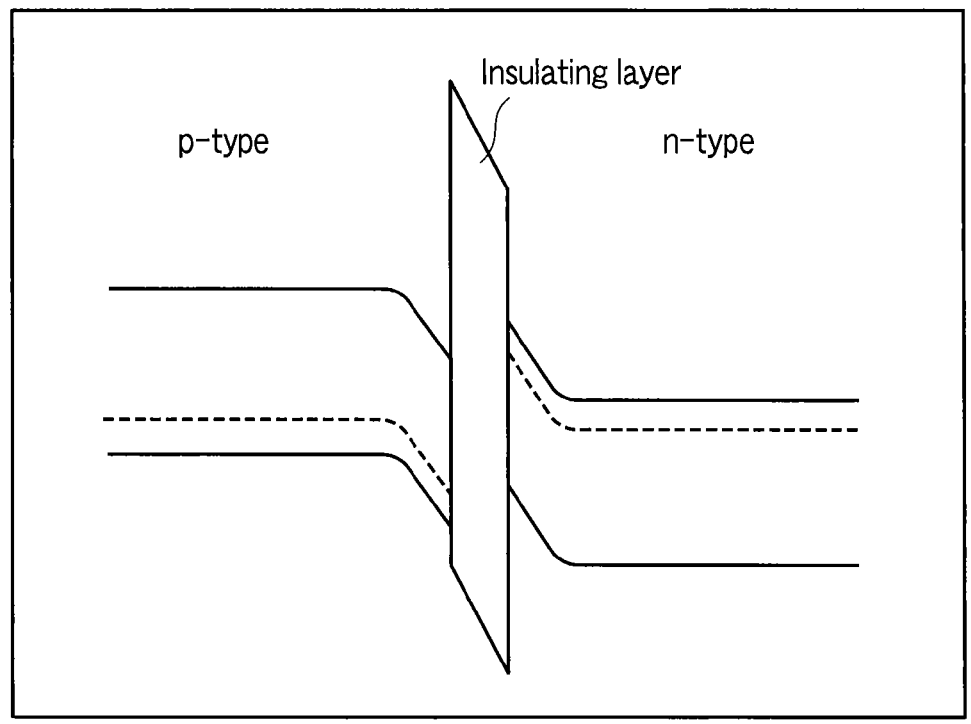
F I G. 13

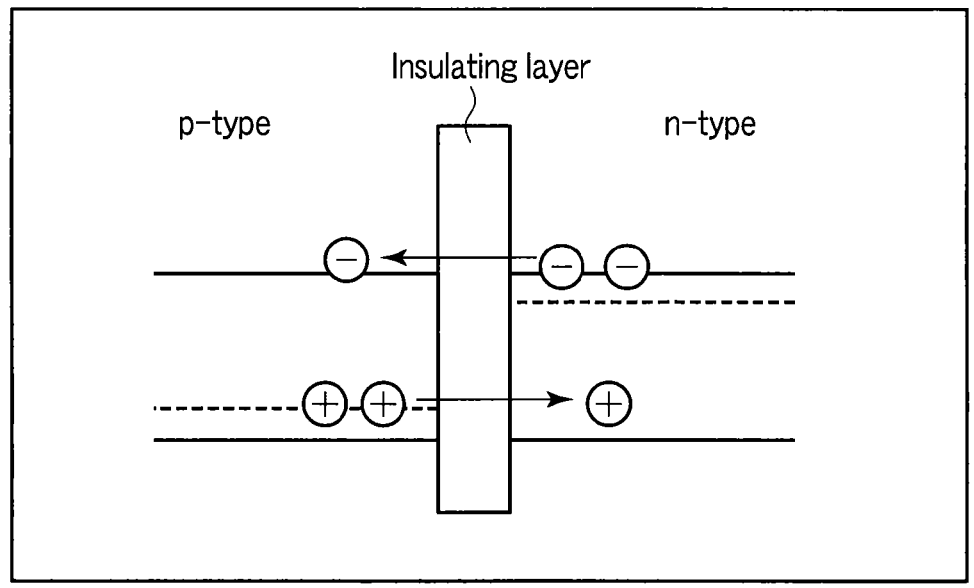
F I G. 14
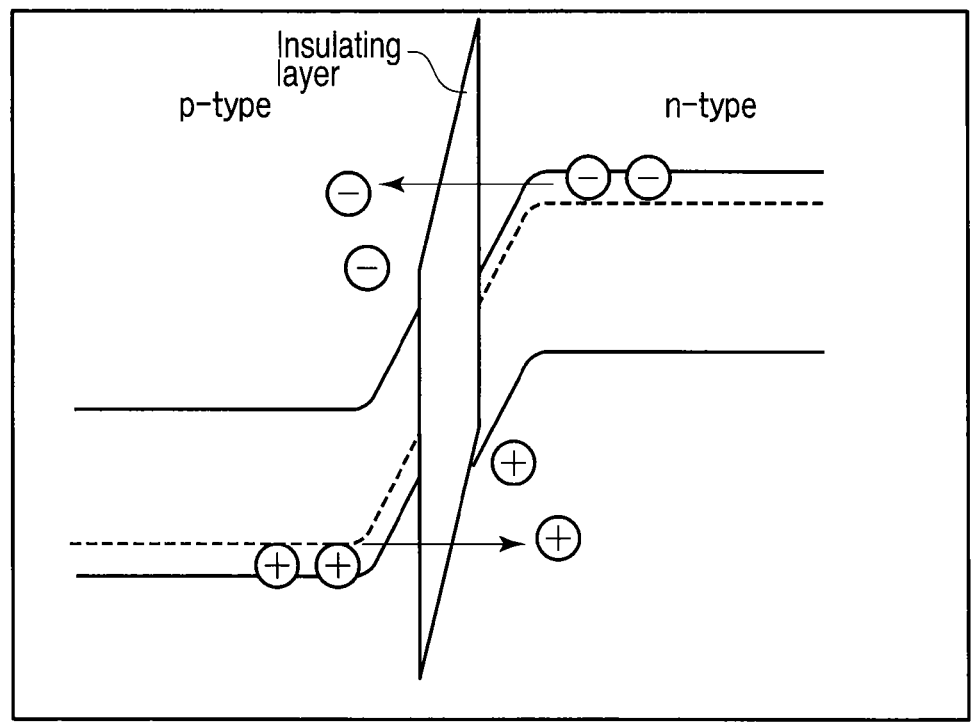
F I G. 15

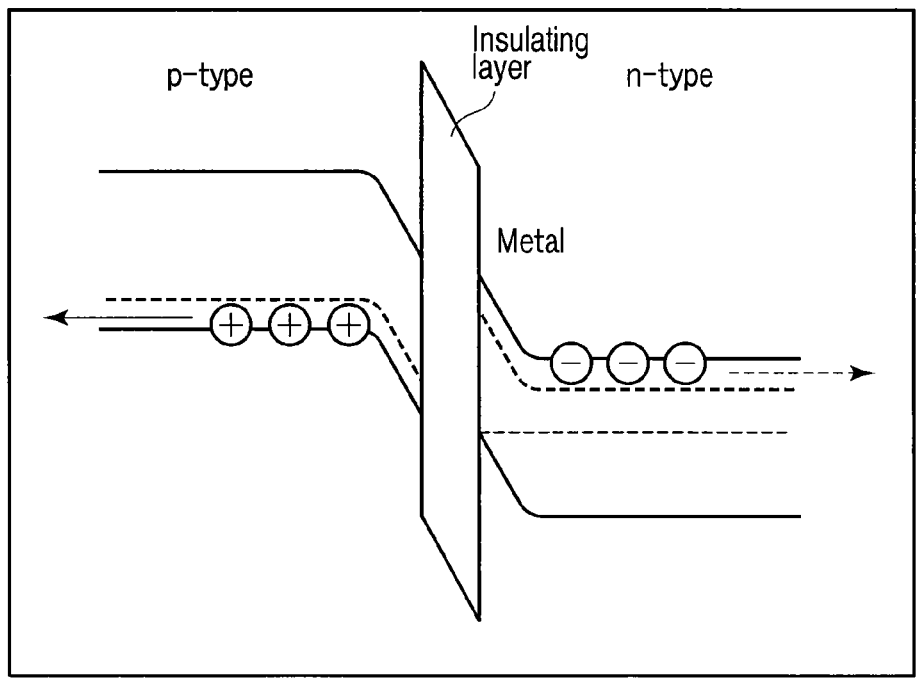
F I G. 16
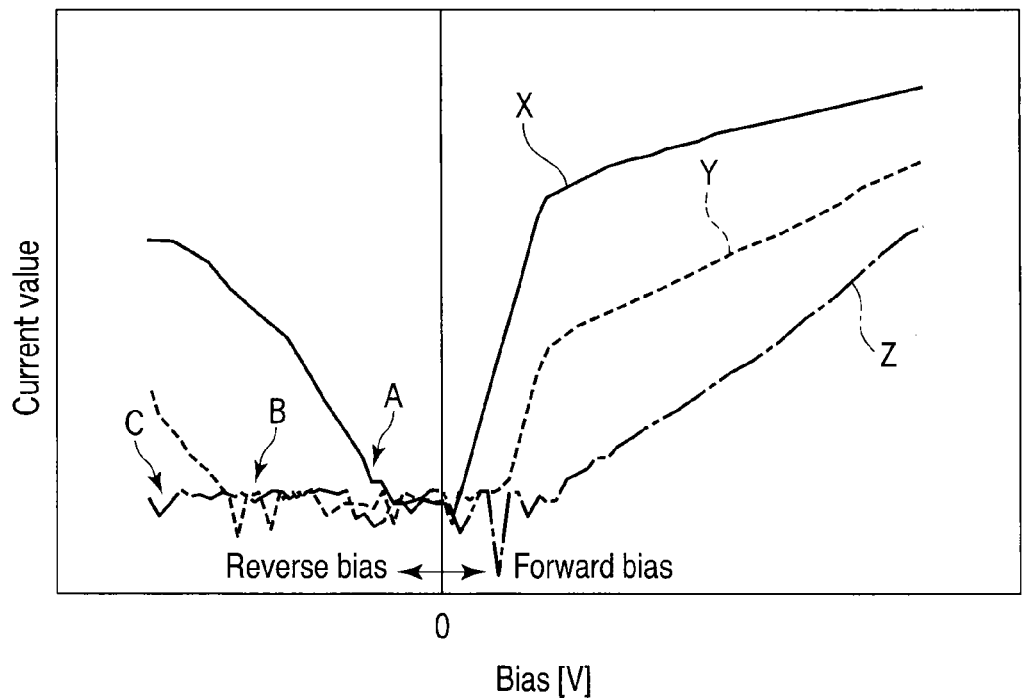
F I G. 17

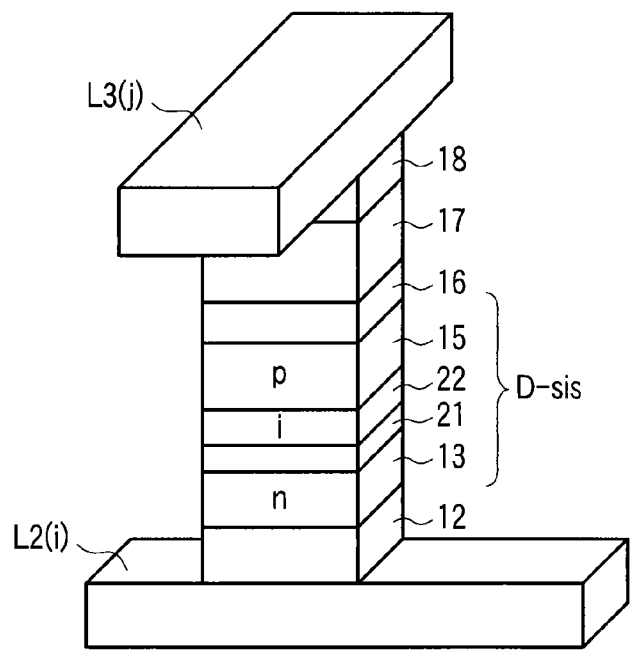
F I G. 20
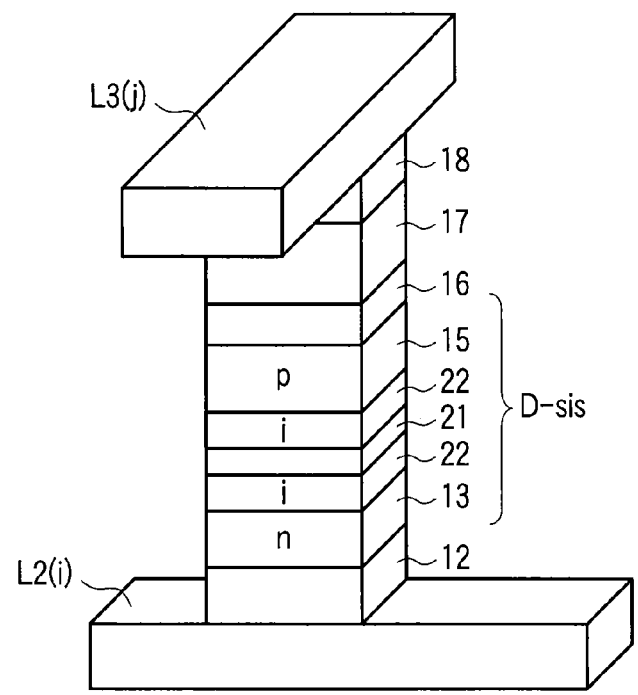
F I G. 21

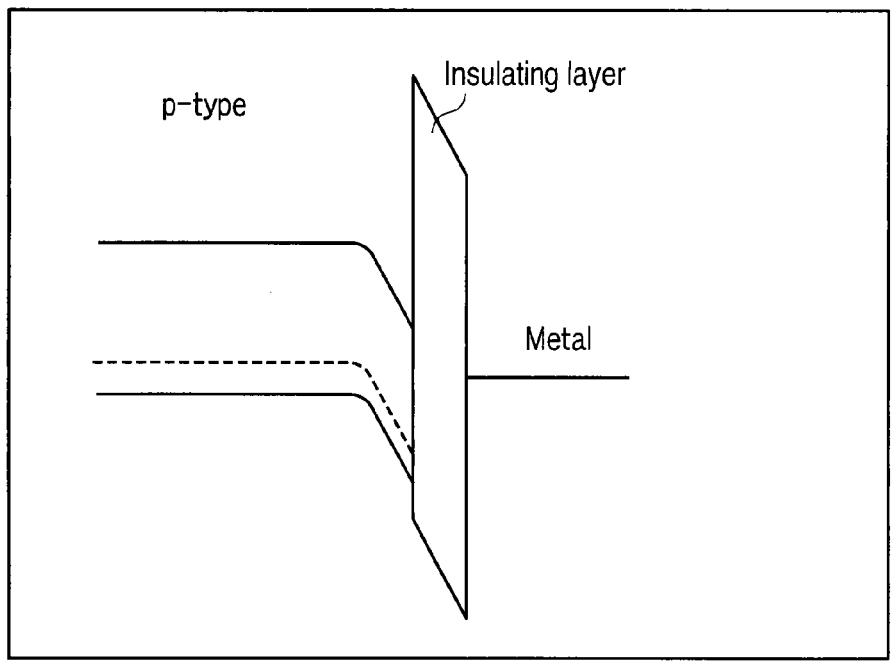
F I G. 24
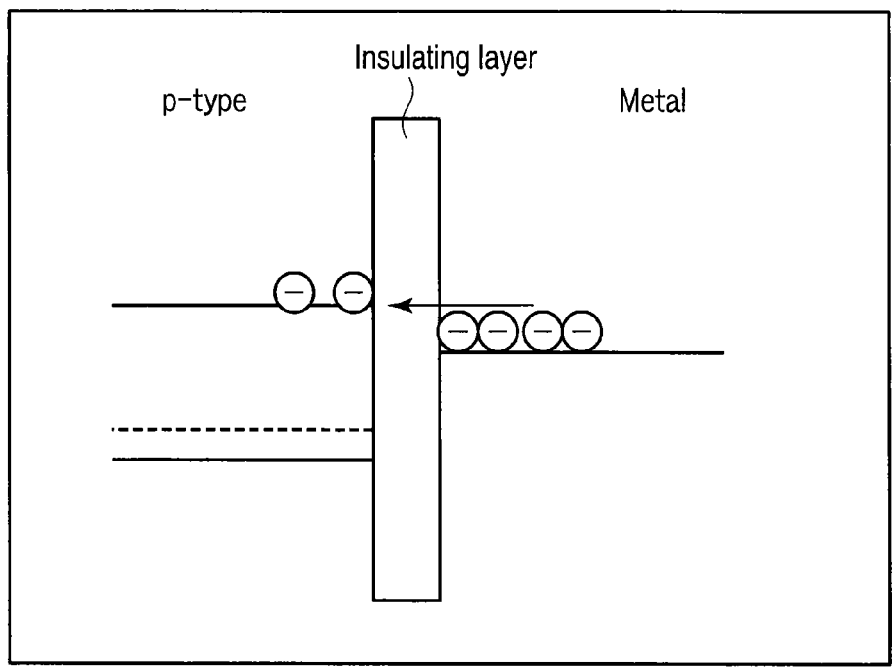
F I G. 25

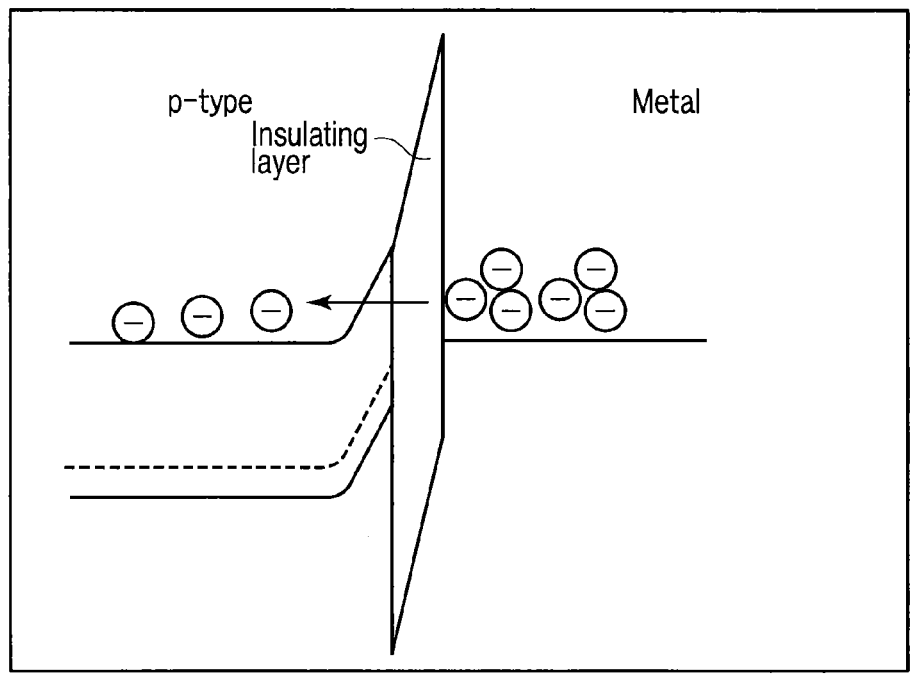
F I G. 26
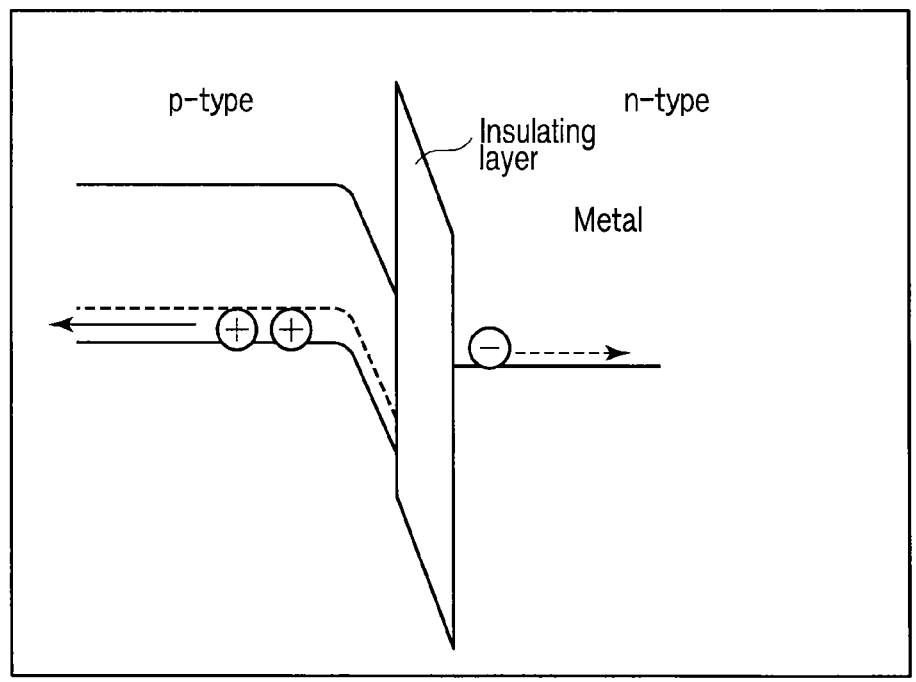
F I G. 27

| Work function | Material |
|---|---|
| 3.7~4.0 | ErSi$_x$、YSi$_x$、LaB$_6$ |
| 4.0~4.4 | HfSi、HfSiN$_x$、TiB、TaC |
| 4.4~4.6 | TaC、HfB、WSi$_{2.5}$、Ta、TaB、NiSi、TaSiN |
| 4.6~4.8 | WSi、TaN、HfN、TiN、TiC |
| 4.8~5.0 | PtSi、WB、WC |
| 5.0~5.3 | RuO$_2$、PtSi、W、Ir、Ru |

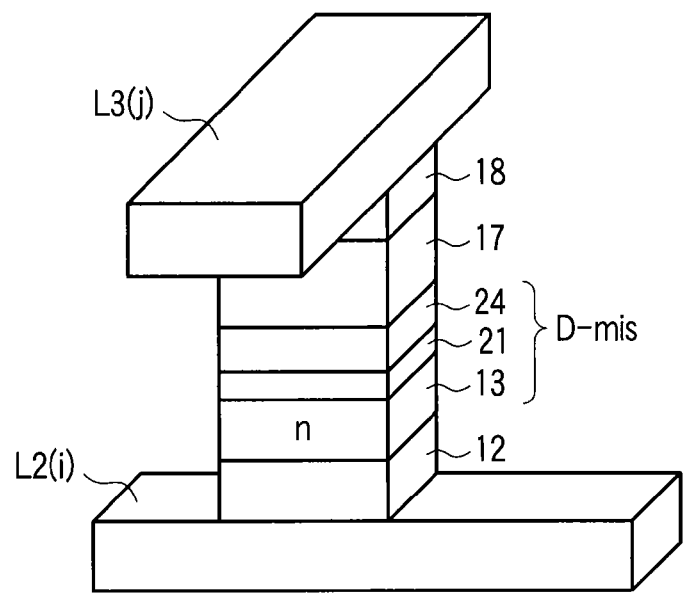
F I G. 32
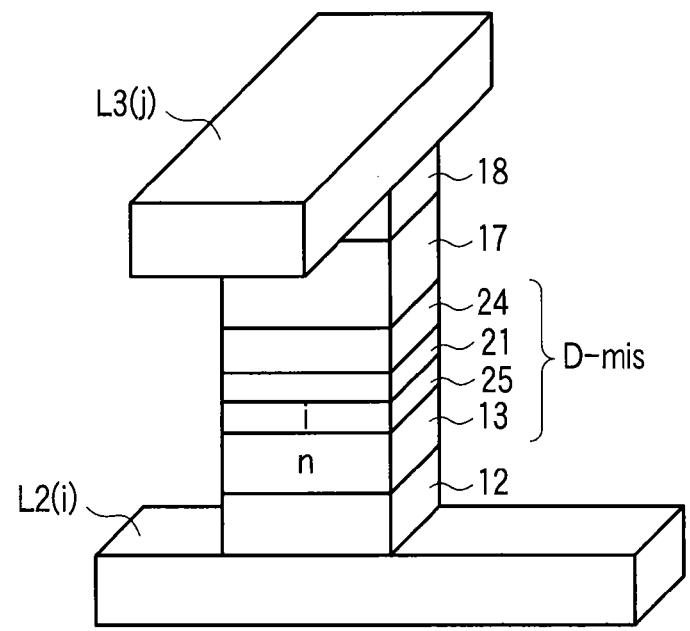
F I G. 33

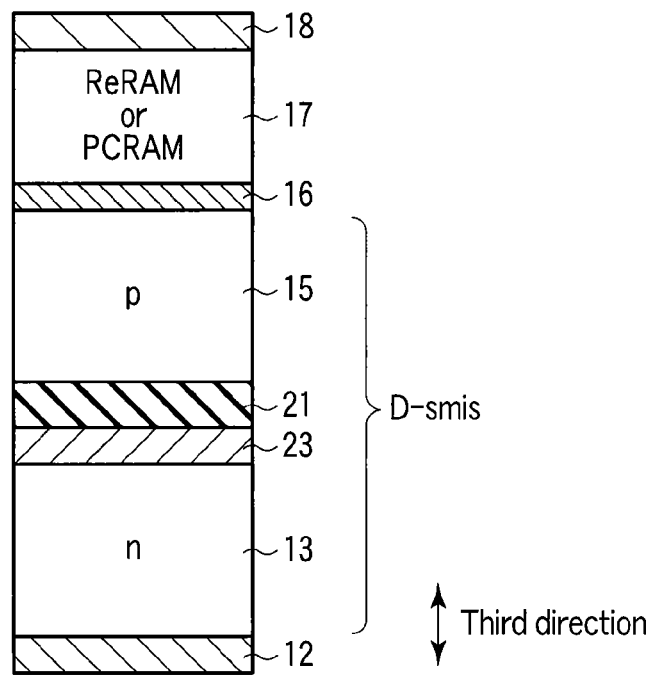
F I G. 34
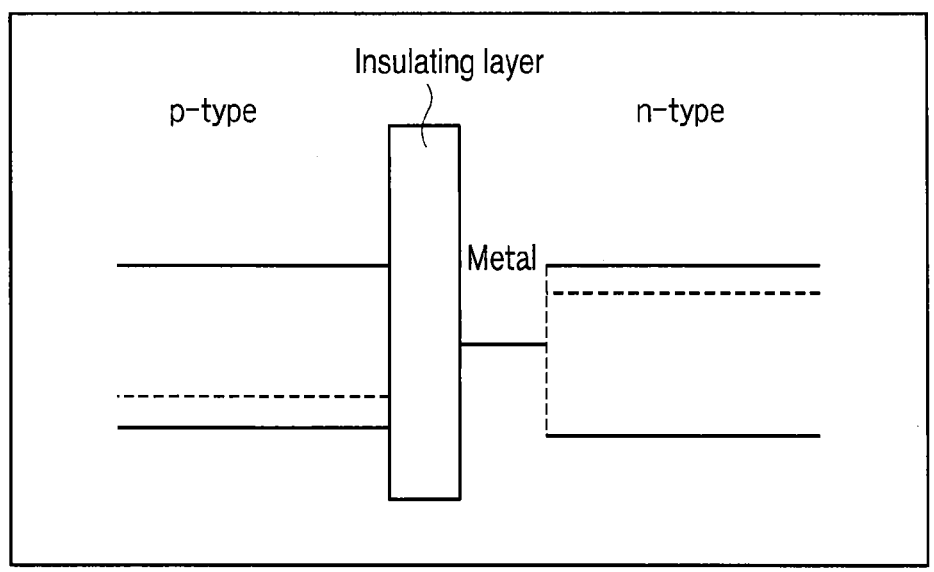
F I G. 35

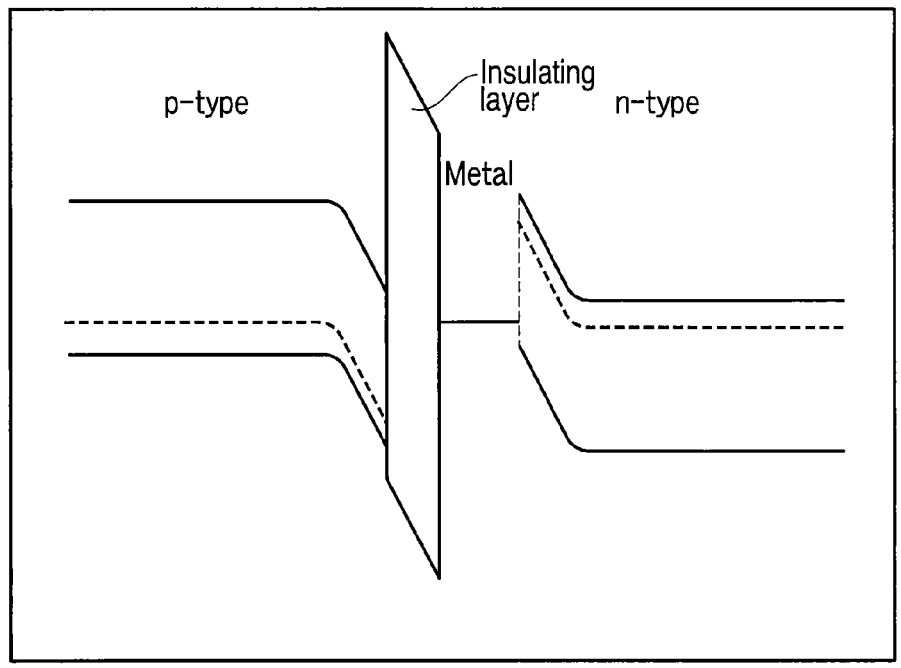
F I G. 36
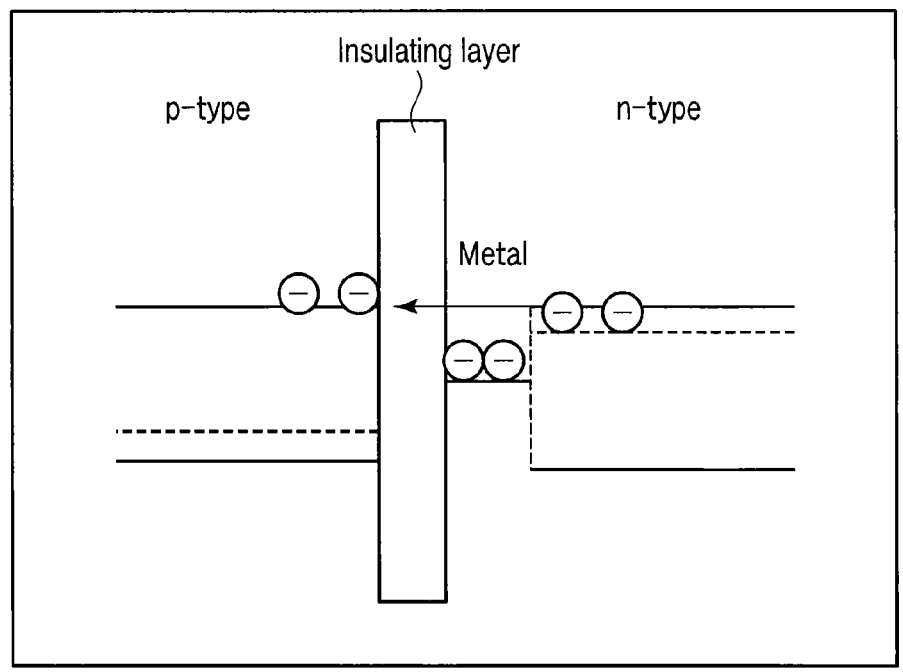
F I G. 37

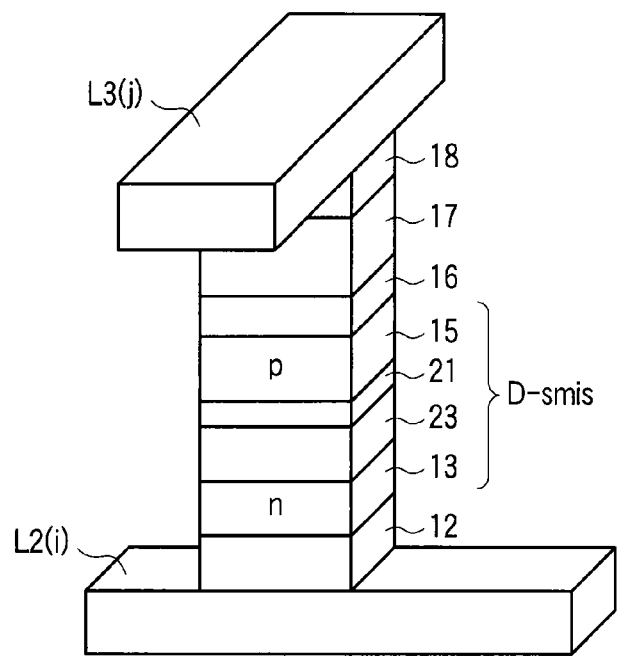
F I G. 42
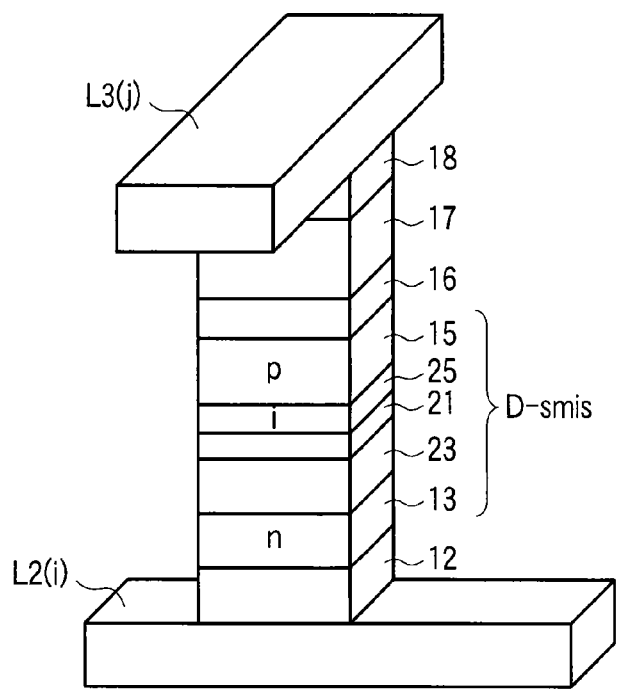
F I G. 43

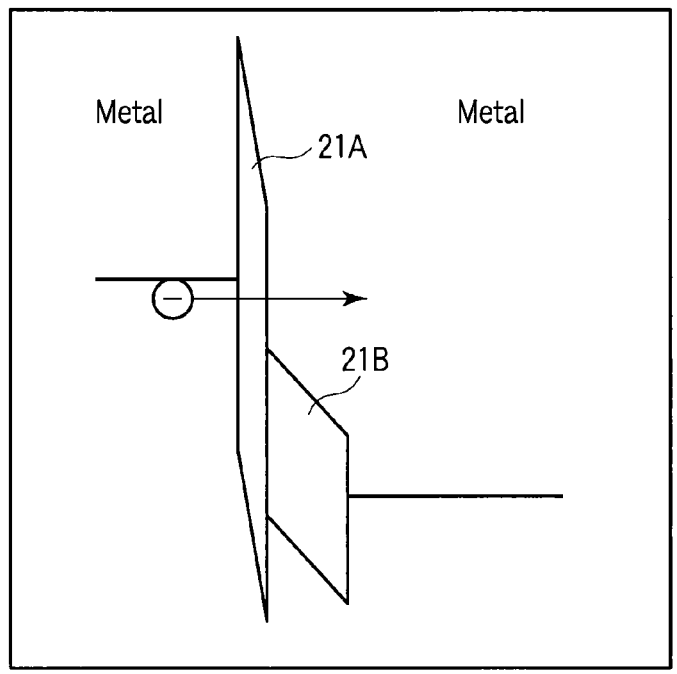
F I G. 48
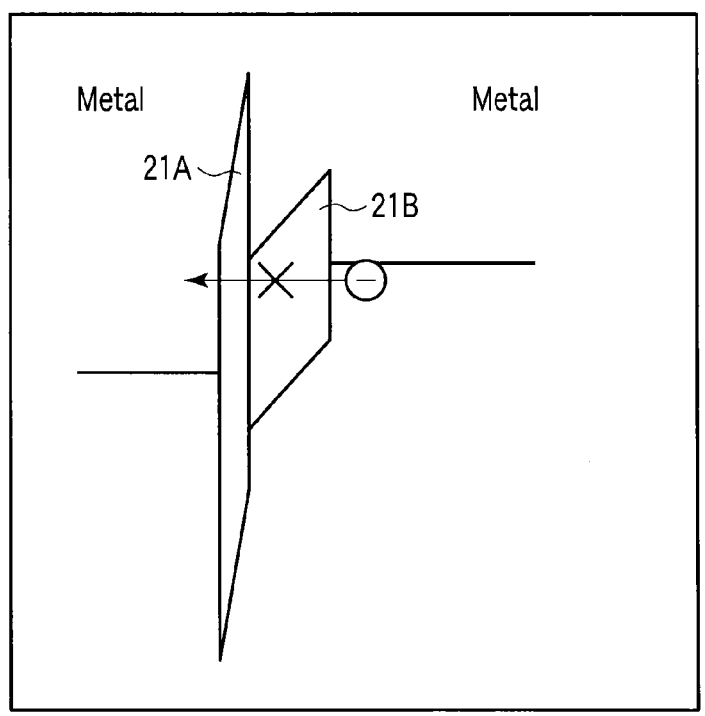
F I G. 49

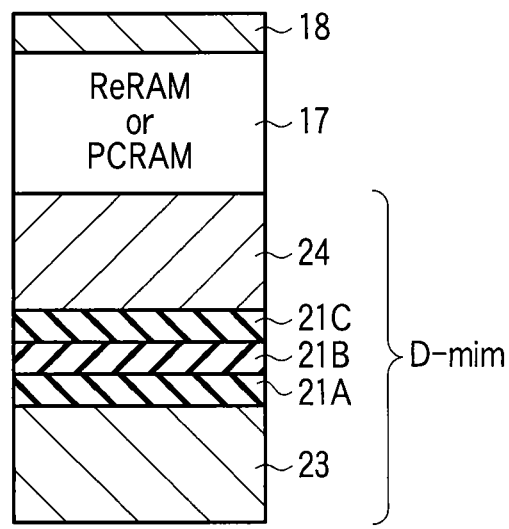
F I G. 50
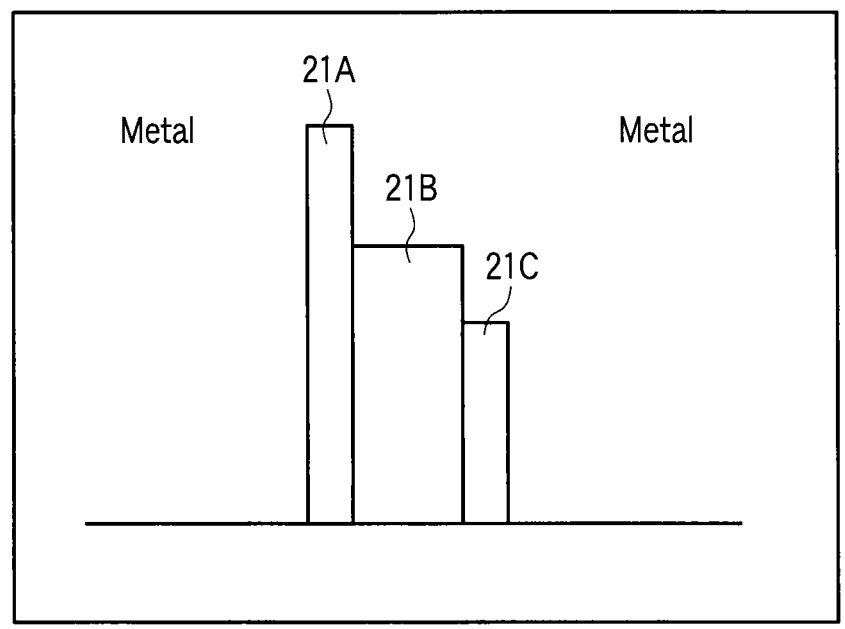
F I G. 51

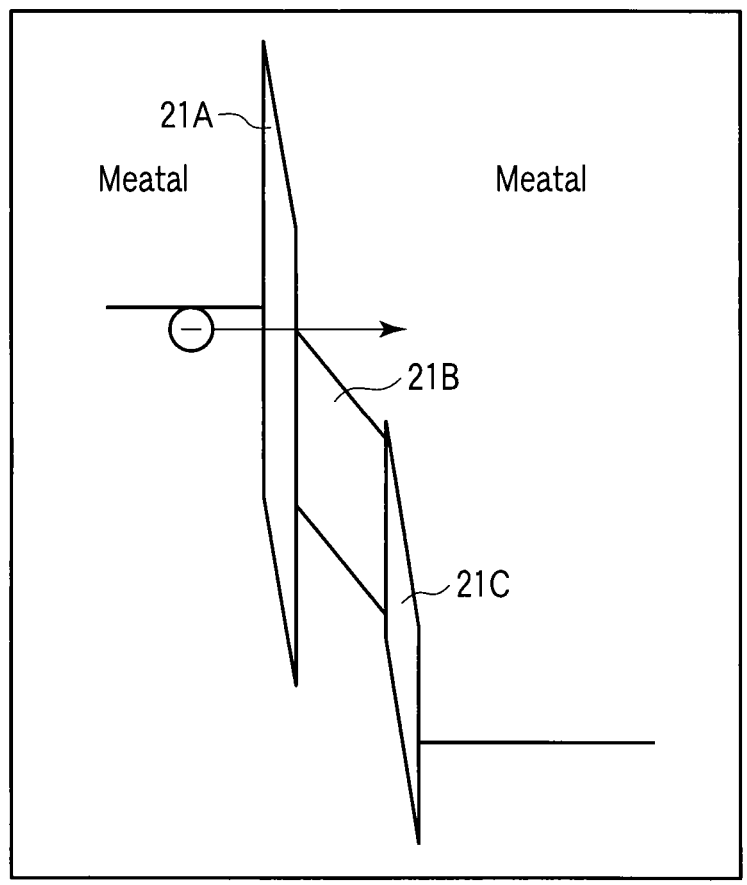
F I G. 52

RESISTANCE CHANGE MEMORY

CROSS-REFERENCE TO RELATED APPLICATIONS

This application is a continuation of and claims the benefit of priority under 35 U.S.C. §120 from U.S. Ser. No. 12/755,891 filed Apr. 7, 2010, and claims the benefit of priority under 35 U.S.C. §119 from Japanese Patent Application No. 2009-141427 filed Jun. 12, 2009, the entire contents of each of which are incorporated herein by reference.

BACKGROUND OF THE INVENTION

1. Field of the Invention

The present invention relates to a resistance change memory having a variable resistive element or a phase-change element as a memory element.

2. Description of the Related Art

Recently, resistance change memories such as ReRAM (Resistive RAM) with a variable resistive element as a memory element and PCRAM (Phase change RAM) with a phase-change element as a memory element are attracting attention as a next-generation nonvolatile semiconductor memory.

Several features of the resistance change memories include (1) a memory cell array of a cross-point type, (2) a large memory capacity realized by three-dimensional integration, and (3) DRAM-like high-speed operation.

When the resistance change memory is put to practical use, for example, the NAND flash memory as a file memory and DRAM as a work memory can be replaced by the resistance change memory.

However, there are many problems to be solved in putting the resistance change memory to practical use. One of the problems is a characteristic and a thickness of a rectifying element necessary for the cross-point type memory cell array.

In the cross-point type memory cell array, the memory element and the rectifying element are connected in series between a word line and a bit line (for example, see Jpn. Pat. Appln. KOKAI Publication Nos. 2005-136425, 2001-236781, 2008-282499, 2007-311772, and 2008-311663).

A large current during application of a forward bias, a small current during application of a reverse bias, and a large breakdown voltage are required for the characteristic of the rectifying element in order to correctly perform the set/reset operation and the read operation.

In order to satisfy the requirements, it is necessary to increase the thickness of the rectifying element. When the thickness of the rectifying element increases, an aspect ratio of a trench formed after the processing of the rectifying element becomes large, which is disadvantageous as regards three-dimensional integration of memory cell arrays.

BRIEF SUMMARY OF THE INVENTION

A resistance change memory according to an aspect of the present invention comprises a first conductive line extending in a first direction, a second conductive line extending in a second direction which is crossed to the first direction, a cell unit including a memory element and a rectifying element connected in series between the first and second conductive lines, and a control circuit which is connected to both of the first and second conductive lines, wherein the control circuit controls a voltage to change a resistance of the memory element between first and second values reversibly, wherein the rectifying element is a diode including an anode layer, a cathode layer and an insulating layer therebetween.

BRIEF DESCRIPTION OF THE SEVERAL VIEWS OF THE DRAWING

FIG. 1 illustrates a resistance change memory according to an embodiment of the invention;
FIGS. 6 to 8 illustrate layouts of first and second control circuits;
FIGS. 12 and 13 illustrate a band structure;
FIGS. 14 and 15 illustrate an operation during a forward bias;
FIG. 16 illustrates an operation during a reverse bias;
FIG. 17 illustrates a relationship between a bias and a current value;
FIGS. 19 to 21 illustrate modifications;
FIGS. 23 and 24 illustrate a band structure;
FIGS. 25 and 26 illustrate an operation during a forward bias;
FIG. 27 illustrates an operation during a reverse bias;
FIG. 32 illustrates an embodiment;
FIG. 33 illustrates a modification;
FIG. 34 illustrates a device structure of an SMIS diode;
FIGS. 35 and 36 illustrate a band structure;
FIGS. 37 and 38 illustrate an operation during a forward bias;
FIG. 42 illustrates an embodiment;
FIG. 43 illustrates a modification;
FIG. 48 illustrates an operation during a forward bias;
FIG. 49 illustrates an operation during a reverse bias;
FIG. 50 illustrates a device structure of an MIM diode;
FIG. 51 illustrates a band structure;
FIG. 52 illustrates an operation during a forward bias.

DETAILED DESCRIPTION OF THE INVENTION

Figure 2:
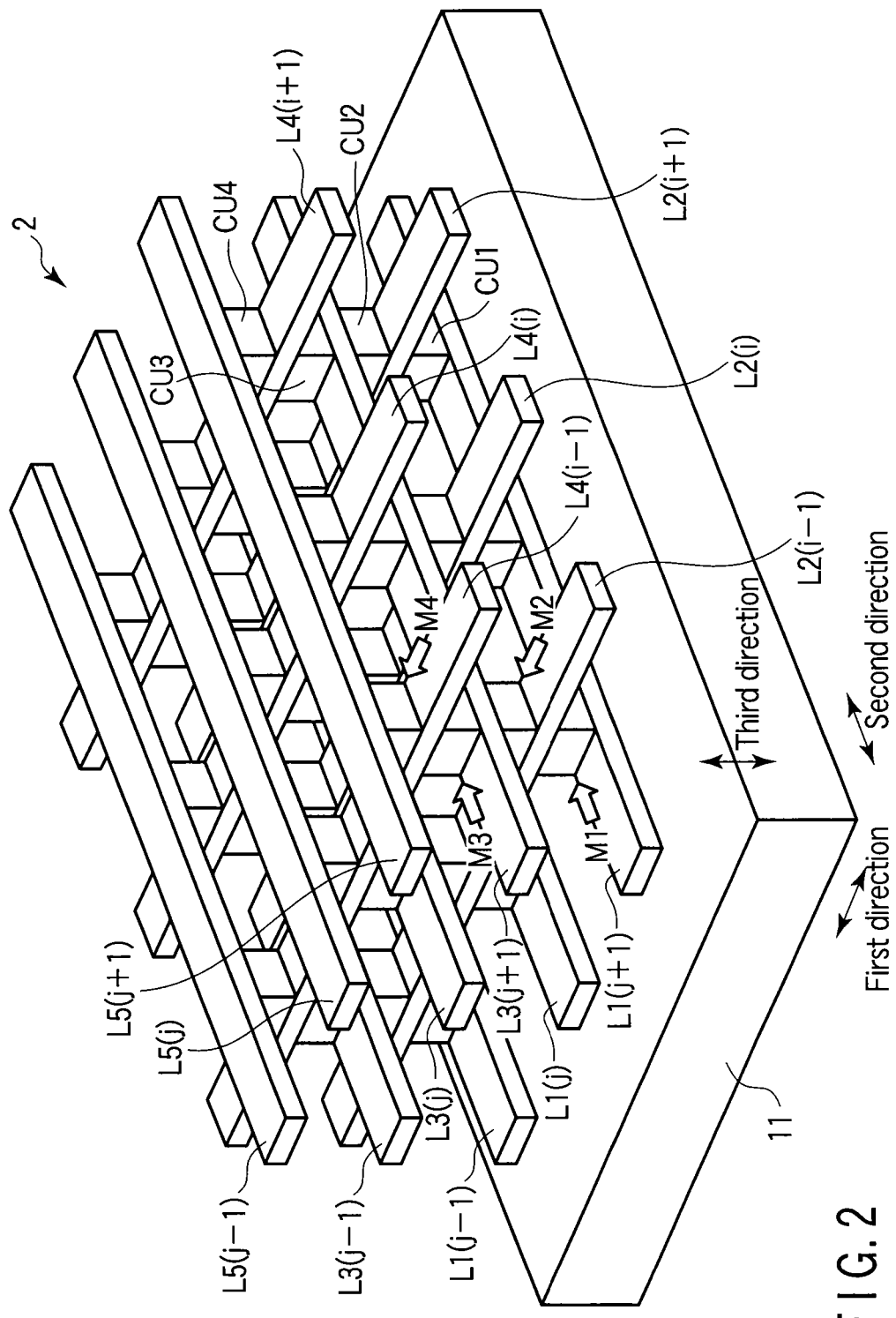
FIG. 2 illustrates a cross-point type memory cell array.

A resistance change memory of an aspect of the present invention will be described below in detail with reference to the accompanying drawings.

1. Basic Concept

The present invention is applied to a resistance change memory in which a memory element is a variable resistive element or a phase-change element. The variable resistive element means an element that is made of a material whose resistance value is changed by a voltage, a current, a heat, or the like. The phase-change element means an element that is made of a material whose physical property such as a resistance and a capacitance is changed by a phase change.

The term phase change (phase transition) embraces the following meanings.

A: Metal-semiconductor transition, metal-insulator transition, metal-metal transition, insulator-insulator transition, insulator-semiconductor transition, insulator-metal transition, semiconductor-semiconductor transition, semiconductor-metal transition, and semiconductor-insulator transition B: Phase change of quantum states (such as metal-superconductor transition)

C: Paramagnetic-ferromagnetic transition, antiferromagnetic-ferromagnetic transition, ferromagnetic-ferromagnetic transition, ferrimagnetic-ferromagnetic transition, and transition of a combination thereof D: Paraelectric-ferroelectric transition, paraelectric-collector transition, paraelectric-piezoelectric transition, ferroelectric-ferroelectric transition, antiferroelectric-ferroelectric transition, and transition of a combination thereof E: Transition of a combination of at least two of A to D Examples of such phase-changing are a transition from a metal, an insulator, semiconductor, a ferroelectric material, a paraelectric material, a collector, a piezoelectric material, a ferromagnetic material, a ferrimagnetic material, a helimagnetic material, a paramagnetic material, or an antiferromagnetic material to a ferroelectric-ferromagnetic material, and a reverse transition thereof.

In accordance with the above definition, a variable resistive element includes a phase-change element. However, in the embodiment, the variable resistive element mainly refers to an element made of a metal oxide, a metal compound, an organic thin film, carbon, carbon nanotube, and the like.

The invention is applied to resistance change memories such as ReRAM with the variable resistive element as the memory element and PCRAM with the phase-change element as the memory element. This is because the resistance change memories which is a cross-point type memory cell array such as the three-dimensional integration have a DRAM-like high-speed operation and a large memory capacity.

In a cross-point type memory cell array, the memory element and the rectifying element are connected in series between the word line and the bit line in order to pass a current only through the selected memory element.

Examples of methods for changing a resistance value of the memory element include a method in which the resistance value of the memory element is reversibly changed between at least a first value and a second value by changing a polarity of a voltage applied to the memory element, and a method in which the resistance value of the memory element is reversibly changed between at least a first value and a second value by controlling the value and time of a voltage applied to the memory element without changing the polarity of the voltage.

The former is called a bipolar operation, and the latter is called a unipolar operation.

In the resistance change memory operating by the bipolar operation, it is preferable that the forward bias characteristics and the reverse bias characteristics of the rectifying element approximate to a line-symmetry to a current axis of I-V characteristics. Therefore, A diode with a MIM structure or a SIS structure, or a transistor with a bipolar transistor structure is used as the rectifying element.

For example, the bipolar operation is adopted in memories, such as a magnetic random access memory, in which a bi-directional current is required in writing the data. It is possible to apply the bipolar operation to the resistance change memory of the invention.

The resistance change memory of the invention will be described using the unipolar operation in which the resistance value of the memory element is reversibly changed between at least the first value and the second value by controlling the value and time of the voltage applied to the memory element without changing the polarity of the voltage.

A large current during the application of the forward bias, a small current during the application of the reverse bias, and a large breakdown voltage are required as characteristics of a rectifying element in order to correctly perform the set/reset operation and the read operation, when the unipolar operation is applied to the resistance change memory (hereinafter referred to as cross-point type resistance change memory) comprising the cross-point type memory cell array.

However, for example, when the rectifying element is formed by a p-n junction diode or a p-i-n diode, it is necessary to increase the thickness of the rectifying element in order to satisfy the above requirements. When the thickness of the rectifying element increases, the aspect ratio of the trench formed after the processing of the rectifying element becomes large, which is disadvantageous as three-dimensional integration of memory cell arrays.

As used herein, the p-n junction diode means a diode that has a p-n junction and comprises a p-type semiconductor layer (anode layer) and an n-type semiconductor layer (cathode layer). The p-i-n diode means a diode in which an intrinsic semiconductor layer is provided between the p-type semiconductor layer (anode layer) and the n-type semiconductor layer (cathode layer).

Therefore, in the embodiment, the rectifying element comprises the anode layer, the cathode layer, and an insulating layer disposed therebetween in order that the rectifying element thickness decrease sufficiently while the rectifying element characteristic is satisfied for the resistance change memory.

Specifically the rectifying element comprises the following diode:

SIS (Semiconductor-Insulator-Semiconductor) diode

The SIS diode has a stacked structure of a p-type semiconductor layer (anode layer), insulating layer, and n-type semiconductor layer (cathode layer).

MIS (Metal-Insulator-Semiconductor) diode

First, the MIS diode has a stacked structure of a metallic layer (anode layer), insulating layer, and n-type semiconductor layer (cathode layer).

Second, the MIS diode has a stacked structure of a metallic layer (cathode layer), insulating layer, and p-type semiconductor layer (anode layer).

SMIS (Semiconductor-Metal-Insulator-Semiconductor) diode

The SMIS diode includes all the elements of the MIS diode, the SMIS diode is categorized as an MIS diode.

First, the SMIS diode has a stacked structure of a p-type semiconductor layer (anode layer), metallic layer (anode layer), and insulating layer-n-type semiconductor layer (cathode layer).

Second, the SMIS diode has a stacked structure of an n-type semiconductor layer (cathode layer), metallic layer (cathode layer), insulating layer, and p-type semiconductor layer (anode layer.

MIM (Metal-Insulator-Metal) diode

The MIM diode has a stacked structure of a metallic layer (anode layer), insulating layer, and metallic layer (cathode layer).

When these diodes are used as a rectifying element for a cross-point type resistance change memory, a decrease in film thickness of the rectifying element, which is satisfied for three-dimensional integration of the memory cell array, and maintenance or improvement of a rectifying characteristic of the rectifying element can be achieved in a generation whose minimum line width is 30 nm or less.

An operation mechanism and an effect of the use of each diode will be described in detail in the following embodiments.

2. Embodiments

(1) Overall View

FIG. 1 illustrates a main part of a resistance change memory according to an embodiment of the invention.

Resistance change memory (for example, chip) 1 comprises cross-point type memory cell array 2. Cross-point type memory cell array 2 has a stacked structure of memory cell arrays.

First control circuit 3 is disposed at one end in a first direction of cross-point type memory cell array 2, and second control circuit 4 is disposed at one end in a second direction intersecting the first direction.

For example, first and second control circuits 3 and 4 select one of stacked memory cell arrays based on a memory cell array selection signal.

For example, first control circuit 3 selects a row of cross-point type memory cell array 2 based on a row address signal. For example, second control circuit 4 selects a column of cross-point type memory cell array 2 based on a column address signal.

First and second control circuits 3 and 4 control data write/erasing/read with respect to a memory element in cross-point type memory cell array 2.

First and second control circuits 3 and 4 can perform the data write/erasing/read with respect to one of the stacked memory cell arrays, and can simultaneously perform the data write/erasing/read with respect to at least two or all the stacked memory cell arrays.

As used herein, in resistance change memory 1, the write is referred to as set and the erasing is referred to as reset. It is necessary for a resistance value in the set state to differ from a resistance value in the reset state, and it does not matter whether the resistance value in the set state is higher or lower than the resistance value in the reset state.

A multi-level resistance change memory in which multi-level data is stored in one memory element can be implemented when one of the resistance values is selectively written during the set operation.

Controller (host) 5 supplies a control signal and data to resistance change memory 1. The control signal is fed into command interface circuit 6, and the data is fed into data input/output buffer 7. The controller 5 may be disposed in chip 1, or in a host (computer) that is different from chip 1.

Command interface circuit 6 determines whether the data from host 5 is command data based on the control signal. When the data from host 5 is command data, command interface circuit 6 transfers the data to state machine 8 from data input/output buffer 7.

State machine 8 manages an operation of resistance change memory 1 based on the command data. For example, state machine 8 manages a set/reset operation and a read operation based on the command data from host 5.

Controller 5 can also determine an operation result in resistance change memory 1 by receiving status information managed by state machine 8.

In the set/reset operation and the read operation, controller 5 supplies an address signal to resistance change memory 1. For example, the address signal includes the memory cell array selection signal, the row address signal, and the column address signal.

The address signal is fed into first and second control circuits 3 and 4 through address buffer 9.

In response to a command from state machine 8, pulse generator 10 outputs a voltage pulse or a current pulse necessary for the set/reset operation and the read operation at a predetermined timing.

(2) Memory Cell Array

FIG. 2 illustrates a cross-point type memory cell array.

Cross-point type memory cell array 2 is disposed on semiconductor substrate (for example, silicon substrate) 11. A circuit element such as a MOS transistor or an insulating film may be sandwiched between cross-point type memory cell array 2 and semiconductor substrate 11.

In FIG. 2, cross-point type memory cell array 2 comprises four memory cell arrays, M1, M2, M3, and M4 stacked in a third direction (direction perpendicular to a principal surface of semiconductor substrate 11) by way of example, and it is necessary that at least two memory cell arrays be stacked.

Memory cell array M1 comprises cell units CU1 that are arrayed in the first and second directions.

Similarly, memory cell array M2 comprises arrayed cell units CU2, memory cell array M3 comprises arrayed cell units CU3, and memory cell array M4 comprises arrayed cell units CU4.

Each of cell units CU1, CU2, CU3, and CU4 comprises a memory element and a rectifying element, which are connected in series.

Conductive lines $L1(j-1)$, $L1(j)$, and $L1(j+1)$, conductive lines $L2(i-1)$, $L2(1)$, and $L2(i+1)$, conductive lines $L3(j-1)$, $L3(j)$, and $L3(j+1)$, conductive lines $L4(i-1)$, $L4(i)$, and $L4(i+1)$, and conductive lines $L5(j-1)$, $L5(j)$, and $L5(j+1)$ are disposed on semiconductor substrate 11.

The odd-numbered conductive lines, that is, conductive lines $L1(j-1)$, $L1(j)$, and $L1(j+1)$, conductive lines $L3(j-1)$, $L3(j)$, and $L3(j+1)$, and conductive lines $L5(j-1)$, $L5(j)$, and $L5(j+1)$ are extended toward the second direction from the side of semiconductor substrate 11.

The even-numbered conductive lines, that is, conductive lines $L2(i-1)$, $L2(1)$, and $L2(i+1)$ and conductive lines $L4(i-1)$, $L4(i)$, and $L4(i+1)$ are extended toward the first direction from the side of semiconductor substrate 11.

The conductive lines act as a word line or a bit line.

Lowermost first memory cell array M1 is disposed between first conductive lines $L1(j-1)$, $L1(j)$, and $L1(j+1)$ and second conductive lines $L2(i-1)$, $L2(i)$, and $L2(i+1)$. In the set/reset operation and the read operation to memory cell array M1, one of conductive lines $L1(j-1)$, $L1(j)$, and $L1(j+1)$ and conductive lines $L2(i-1)$, $L2(i)$, and $L2(i+1)$ acts as the word line, and the other acts as the bit line.

Memory cell array M2 is disposed between second conductive lines $L2(i-1)$, $L2(i)$, and $L2(i+1)$ and third conductive lines $L3(j-1)$, $L3(j)$, and $L3(j+1)$. In the set/reset operation and the read operation to memory cell array M2, one of conductive lines L2(i−1), L2(i), and L2(i+1) and conductive lines L3(j−1), L3(j), and L3(j+1) acts as the word line, and the other acts as the bit line.

Memory cell array M3 is disposed between third conductive lines L3(j−1), L3(j), and L3(j+1) and fourth conductive lines L4(i−1), L4(i), and L4(i+1). In the set/reset operation and the read operation to memory cell array M3, one of conductive lines L3(j−1), L3(j), and L3(j+1) and conductive lines L4(i−1), L4(i), and L4(i+1) acts as the word line, and the other acts as the bit line.

Memory cell array M4 is disposed between fourth conductive lines L4(i−1), L4(i), and L4(i+1) and fifth conductive lines L5(j−1), L5(1), and L5(j+1). In the set/reset operation and the read operation to memory cell array M4, one of the conductive lines L4(i−1), L4(i), and L4(i+1) and conductive lines L5(j−1), L5(j), and L5(j+1) acts as the word line, and the other acts as the bit line.

(3) Cell Unit

Figures 3, 4:
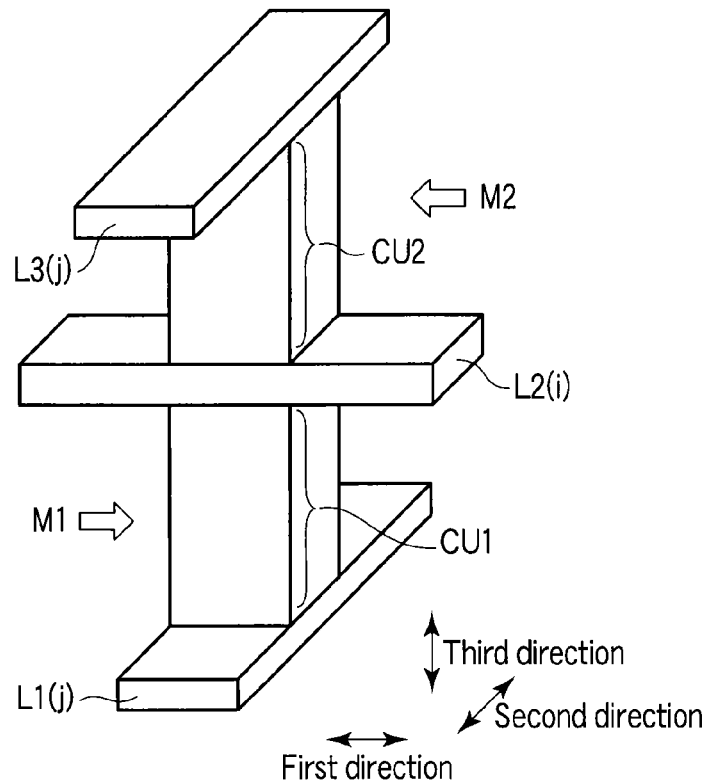
FIG. 3 illustrates a cell unit.
FIGS. 4 and 5 illustrate connection relationships between a memory element and a rectifying element.

FIG. 3 illustrates a cell unit in two memory cell arrays.

FIG. 3 illustrates, for example, cell units CU1 and CU2 in memory cell arrays M1 and M2 of FIG. 2. At this point, configurations of the cell units in memory cell arrays M3 and M4 of FIG. 2 are similar to those of the cell units of memory cell arrays M1 and M2 of FIG. 2.

Each of cell units CU1 and CU2 comprises the memory element and the rectifying element, which are connected in series.

There are various patterns in a connection relationship between the memory element and the rectifying element.

However, it is necessary that the connection relationships between the memory element and the rectifying element be identical to one another in all the cell units of one memory cell array.

Figure 5:
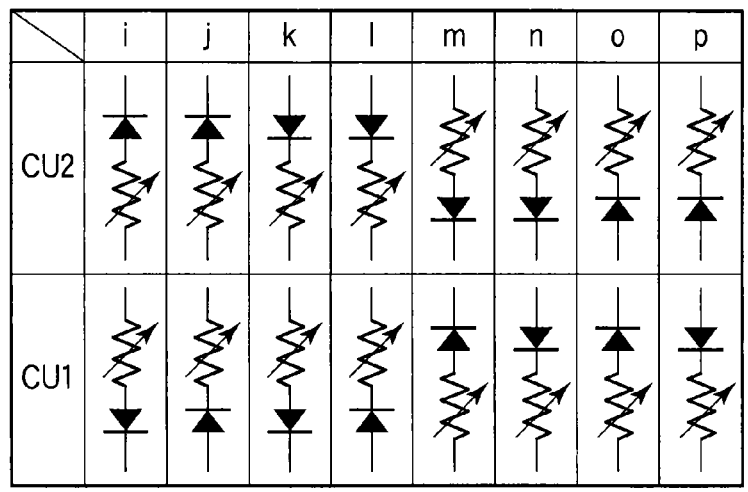

FIGS. 4 and 5 illustrate connection relationships between the memory element and the rectifying element.

In one cell unit, a total of 4 ways exist in the connection relationship between the memory element and the rectifying element, that is, 2 ways exist in a positional relationship between the memory element and the rectifying element and 2 ways exist in an orientation of the rectifying element. Accordingly, for the cell units of the two memory cell arrays, patterns of 16 ways (4 ways×4 ways) exist in the connection relationship between the memory element and the rectifying element.

In FIGS. 4 and 5, the letters (a) to (p) designate the connection relationship of 16 ways.

In cell units CU1 and CU2, the lower side of the drawings is the semiconductor substrate side.

Although the embodiment can be applied to all the connection relationship of 16 ways, the connection relationship (c) will mainly be described below by way of example.

This is because that two cell units being adjacent to each other can share a conductive line L as a common word line or a common bit line, when the diodes in the two cell units are arranged symmetrically to the conductive line L. As a result, the operation of the resistance change memory is easily controlled.

(4) Layout of First and Second Control Circuits

Figure 6:
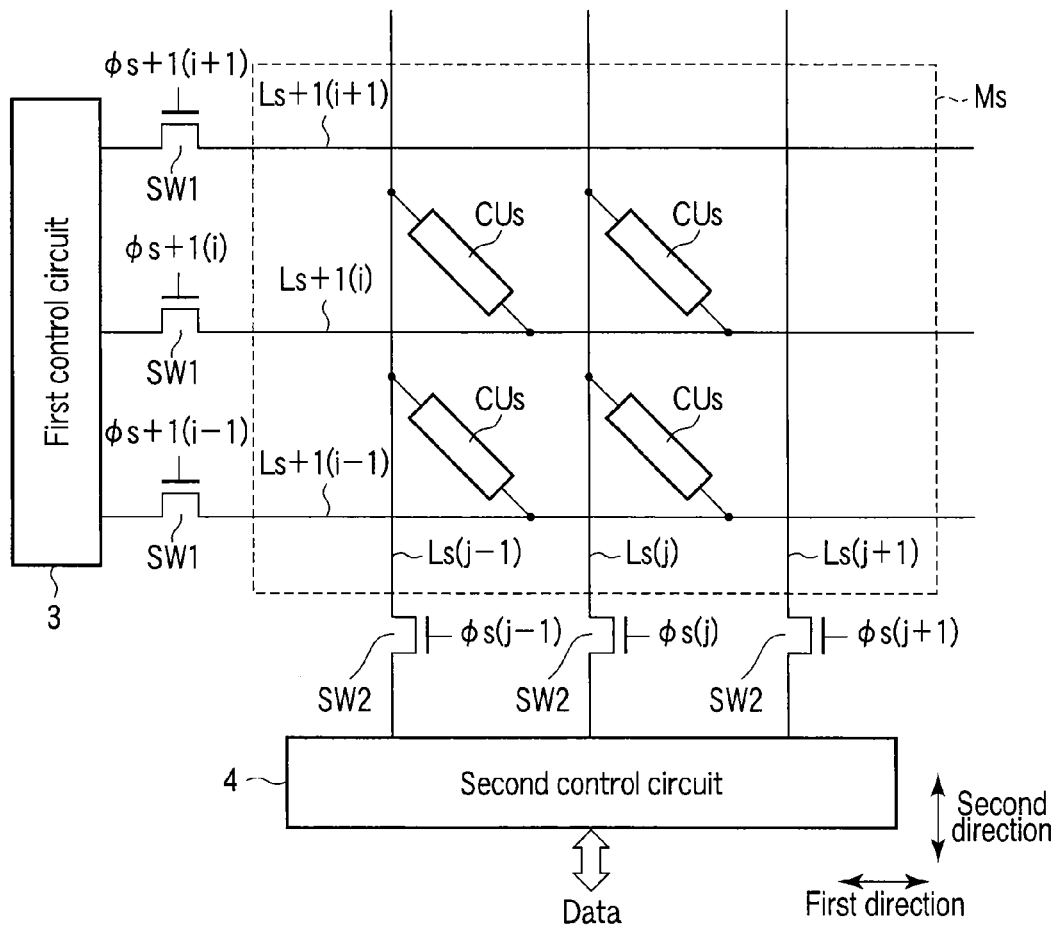

FIGS. 6 and 7 illustrate a first example of a layout of the first and second control circuits.

Memory cell array Ms corresponding to one of the layers of memory cell arrays M1, M2, M3, and M4 of FIG. 2 comprises cell units CUs arrayed as illustrated in FIG. 6. One end of cell unit CUs is connected to conductive lines Ls(j−1), Ls(j), and Ls(j+1), and the other end is connected to conductive lines Ls+1(i−1), Ls+1(i), and Ls+1(i+1).

As illustrated in FIG. 7, memory cell array Ms+1 comprises arrayed cell units CUs+1. One end of cell unit CUs+1 is connected to conductive lines Ls+1(i−1), Ls+1(i), and Ls+1(i+1), and the other end is connected to conductive lines Ls+2(j−1), Ls+2(j), and Ls+2(j+1).

Where s is 1, 3, 5, 7, . . . .

First control circuit 3 is connected to one end in the first direction of each of conductive lines Ls+1(i−1), Ls+1(i), and Ls+1(i+1) through switch element SW1. For example, switch circuit SW1 comprises an N-channel FET (Field Effect Transistor) that is controlled by control signals $\phi+1(i-1)$, $\phi+1(i)$, and $\phi+1(i+1)$.

Second control circuit 4 is connected to one end in the second direction of each of conductive lines Ls(j−1), Ls(j), and Ls(j+1) through switch element SW2. For example, switch circuit SW2 comprises the N-channel FET that is controlled by control signals $\phi s(j-1)$, $\phi s(j)$, and $\phi s(j+1)$.

Second control circuit 4 is connected to one end in the second direction of each of the conductive lines Ls+2(j−1), Ls+2(j), and Ls+2(j+1) through switch element SW2. For example, switch circuit SW2 comprises the N-channel FET that is controlled by control signals $\phi s+2(j-1)$, $\phi s+2(j)$, and $\phi s+2(j+1)$.

Figure 8:
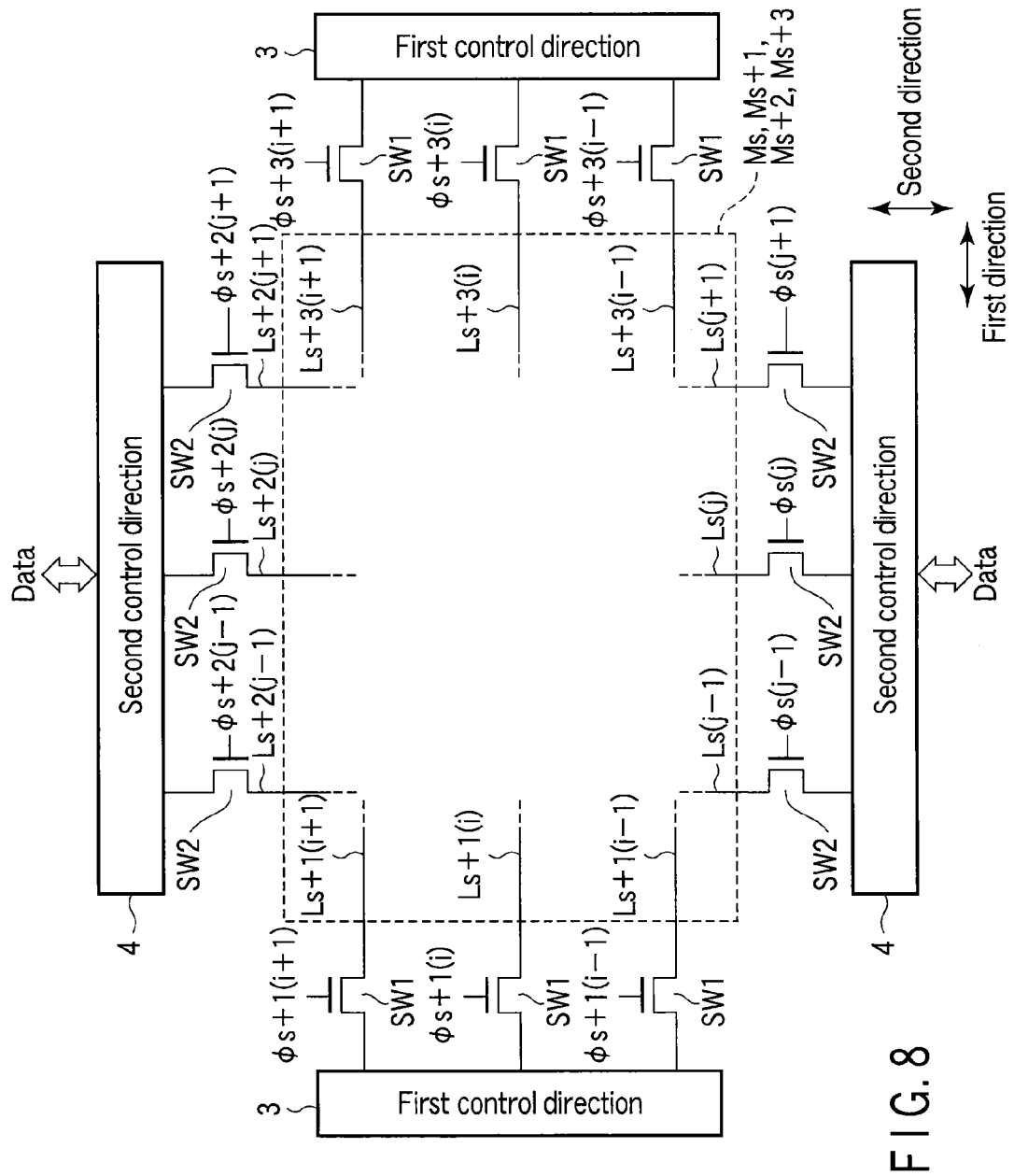

FIG. 8 illustrates a second example of a layout of the first and second control circuits.

The layout of the second example differs from the layout of the first example in that first control circuits 3 are disposed at both ends in the first direction of each of the memory cell arrays Ms, Ms+1, Ms+2, and Ms+3 while second control circuits 4 are disposed at both ends in the second direction of each of the memory cell arrays Ms, Ms+1, Ms+2, and Ms+3.

Where s is 1, 5, 9, 13, . . . .

First control circuits 3 are connected to both ends in the first direction of each of conductive lines Ls+1(i−1), Ls+1(i), and Ls+1(i+1) through switch elements SW1. For example, switch circuit SW1 comprises the N-channel FET that is controlled by control signals $\phi+1(i-1)$, $\phi+1(i)$, $\phi+1(i+1)$, $\phi s+3(i-1)$, $\phi s+3(i)$, and $\phi s+3(i+1)$.

Second control circuits 4 are connected to both ends in the second direction of each of conductive lines Ls(j−1), Ls(j), and Ls(j+1) through switch elements SW2. For example, switch circuit SW2 comprises the N-channel FET that is controlled by control signals $\phi s(j-1)$, $\phi s(j)$, $\phi s(j+1)$, $\phi s+2(j-1)$, $\phi s+2(j)$, and $\phi s+2(j+1)$.

(5) Operation

An operation of the resistance change memory will be described.

Figure 9:
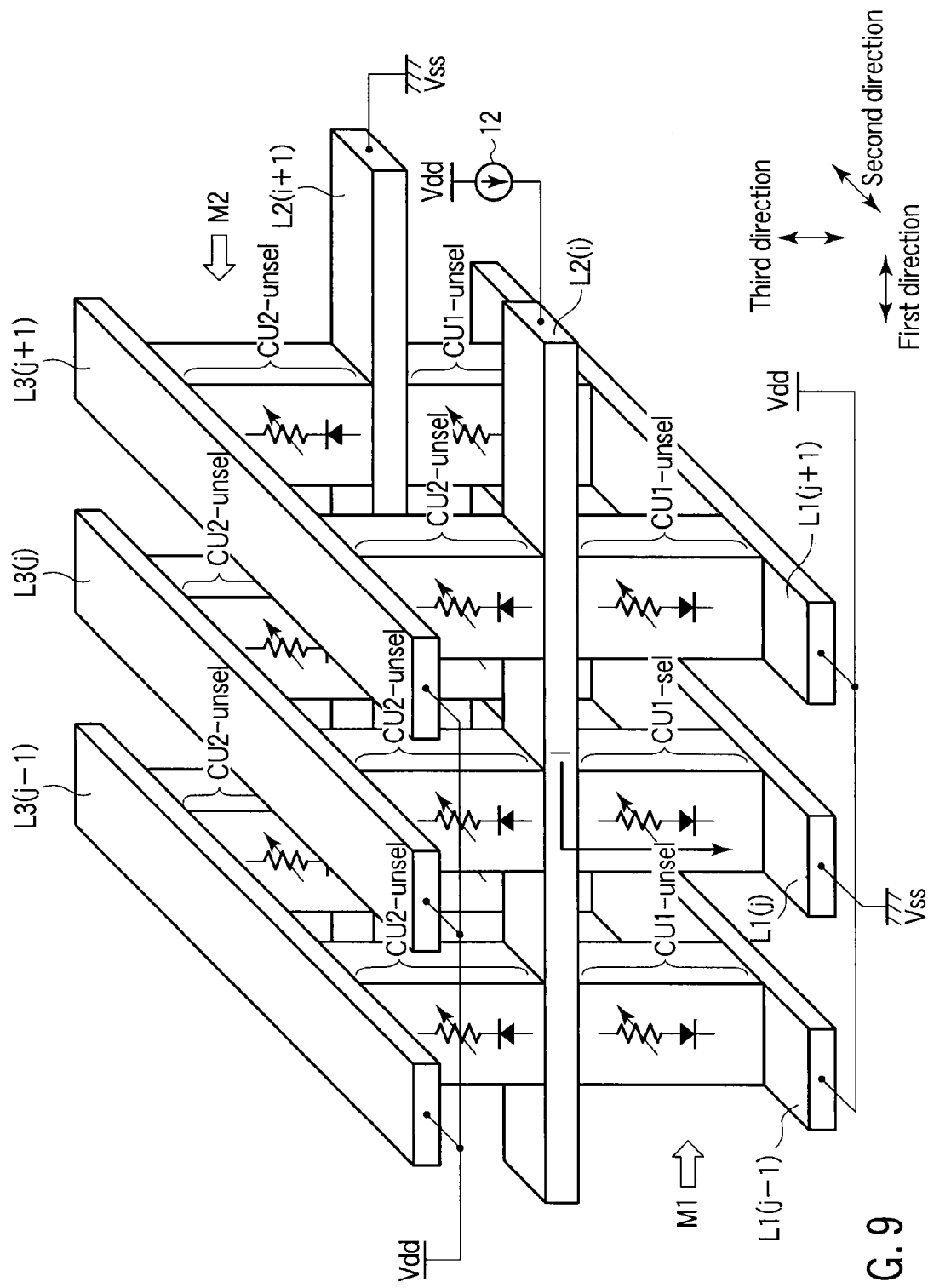
FIG. 9 illustrates an operation of the resistance change memory.

FIG. 9 illustrates two memory cell arrays.

Memory cell array M1 of FIG. 9 corresponds to the memory cell array M1 of FIG. 2, and memory cell array M2 of FIG. 9 corresponds to memory cell array M2 of FIG. 2.

The connection relationship between the memory element and the rectifying element in cell units CU1 and CU2 corresponds to connection relationship (c) of FIG. 4.

A. Set Operation

A write (set) operation performed to selected cell unit CU1-sel in memory cell array M1 will be described.

An initial state of selected cell unit CU1-sel is an erasing (reset) state.

It is assumed that the reset state is a high-resistance state (100 kΩ to 1 MΩ) while the set state is a low-resistance state (1 KΩ to 10 KΩ).

Selected conductive line L2($i$) is connected to high-potential-side power supply potential Vdd, and selected conductive line L1($j$) is connected to low-potential-side power supply potential Vss.

In the first conductive lines from the semiconductor substrate side, non-selected conductive lines L1($j$−1) and L1($j$+1) other than selected conductive line L1($j$) are connected to power supply potential Vdd. In the second conductive lines from the semiconductor substrate side, non-selected conductive line L2($i$+1) other than selected conductive line L2($i$) is connected to power supply potential Vss.

Third non-selected conductive lines L3($j$−1), L3($j$), and L3($j$+1) from the semiconductor substrate side are connected to power supply potential Vdd.

At this point, because the forward bias is applied to the rectifying element (diode) in selected cell unit CU1-sel, set current I-set is passed from a constant current source to selected cell unit CU1-sel, and the resistance value of the memory element in selected cell unit CU1-sel changes from the high-resistance state to the low-resistance state.

In the set operation, a voltage of 1 to 2 V is applied to the memory element in selected cell unit CU1-sel, and the current density of set current I-set passed through the memory element (high-resistance state) is set to a range of $1\times10^5$ to $1\times10^7$ A/cm$^2$.

On the other hand, in non-selected cell units CU1-unsel in memory cell array M1, the reverse bias is applied to the rectifying element (diode) in the cell unit, which is connected between non-selected conductive lines L1($j$−1) and L1($j$+1) and non-selected conductive line L2($i$+1).

Similarly, in non-selected cell units CU2-unsel in memory cell array M2, the reverse bias is applied to the rectifying element (diode) in the cell unit, which is connected between non-selected conductive line L2($i$+1) and non-selected conductive lines L3($j$−1), L3($j$), and L3($j$+1).

Accordingly, a sufficiently small current during the application of the reverse bias and sufficiently large breakdown voltage are required for the characteristic of the rectifying element in the cell unit.

B. Reset Operation

An erasing (reset) operation performed to selected cell unit CU1-sel in memory cell array M1 will be described.

Selected conductive line L2($i$) is connected to high-potential-side power supply potential Vdd, and selected conductive line L1($j$) is connected to low-potential-side power supply potential Vss.

In first conductive lines from the semiconductor substrate side, non-selected conductive lines L1($j$−1) and L1($j$+1) other than selected conductive line L1($j$) are connected to power supply potential Vdd. In the second conductive lines from the semiconductor substrate side, non-selected conductive line L2($i$+1) other than selected conductive line L2($i$) is connected to power supply potential Vss.

Third non-selected conductive lines L3($j$−1), L3($j$), and L3($j$+1) from the semiconductor substrate side are connected to power supply potential Vdd.

At this point, because the forward bias is applied to the rectifying element (diode) in selected cell unit CU1-sel, reset current I-reset is passed from the constant current source to selected cell unit CU1-sel, and the resistance value of the memory element in selected cell unit CU1-sel changes from the low-resistance state to the high-resistance state.

In the reset operation, the voltage of 1 to 3 V is applied to the memory element in selected cell unit CU1-sel, and the current density of reset current I-reset passed through the memory element (low-resistance state) is set to a range of $1\times10^3$ to $1\times10^6$ A/cm$^2$.

On the other hand, in non-selected cell units CU1-unsel in memory cell array M1, the reverse bias is applied to the rectifying element (diode) in the cell unit, which is connected between non-selected conductive lines L1($j$−1) and L1($j$+1) and non-selected conductive line L2($i$+1).

Similarly, in non-selected cell units CU2-unsel in memory cell array M2, the reverse bias is applied to the rectifying element (diode) in the cell unit, which is connected between non-selected conductive line L2($i$+1) and non-selected conductive lines L3($j$−1), L3($j$), and L3($j$+1).

Accordingly, a sufficiently small current during the application of the reverse bias and sufficiently large breakdown voltage are required for the characteristic of the rectifying element in the cell unit.

Set current I-set and reset current I-reset differ from each other. The voltage applied to the memory element in selected cell unit CU1-sel in order to produce set current I-set and reset current I-reset depends on a material for the memory element.

C. Read Operation

A read operation performed to selected cell unit CU1-sel in memory cell array M1 will be described.

Selected conductive line L2($i$) is connected to high-potential-side power supply potential Vdd, and selected conductive line L1($j$) is connected to low-potential-side power supply potential Vss.

In first conductive lines from the semiconductor substrate side, non-selected conductive lines L1($j$−1) and L1($j$+1) other than selected conductive line L1($j$) are connected to power supply potential Vdd. In the second conductive lines from the semiconductor substrate side, non-selected conductive line L2($i$+1) other than selected conductive line L2($i$) is connected to power supply potential Vss.

Third non-selected conductive lines L3($j$−1), L3($j$), and L3($j$+1) from the semiconductor substrate side are connected to power supply potential Vdd.

At this point, because the forward bias is applied to the rectifying element (diode) in selected cell unit CU1-sel, read current I-read is passed from the constant current source to the memory element (high-resistance state or low-resistance state) in selected cell unit CU1-sel.

Accordingly, for example, the data (resistance value) of the memory element can be read by detecting a potential change at a sense node in passing read current I-read through the memory element.

At this point, it is necessary that read current I-read be sufficiently smaller than set current I-set and reset current I-reset such that the resistance value of the memory element does not change during the read operation.

As with the set/reset operation, during the read operation, the reverse bias is applied to the rectifying element (diode) in the cell unit which is connected between non-selected conductive lines L1($j$−1) and L1($j$+1) and non-selected conductive line L2($i$+1), in non-selected cell units CU1-unsel in memory cell array M1.

Similarly, in non-selected cell units CU2-unsel in memory cell array M2, the reverse bias is applied to the rectifying element (diode) in the cell unit which is connected between non-selected conductive line L2($i$+1) and non-selected conductive lines L3($j$−1), L3($j$), and L3($j$+1).

Accordingly, a sufficiently small current during the application of the reverse bias and sufficiently large breakdown voltage are required for the characteristic of the rectifying element in the cell unit.

(6) Rectifying Element

The rectifying element (non-ohmic element) used in the resistance change memory of the embodiment will be described in detail. The connection relationship between the memory element and the rectifying element in the cell unit is shown in (c) of FIG. 4.

A. P-i-n Diode

The p-i-n diode will briefly be described as a comparative example.

Figure 10:
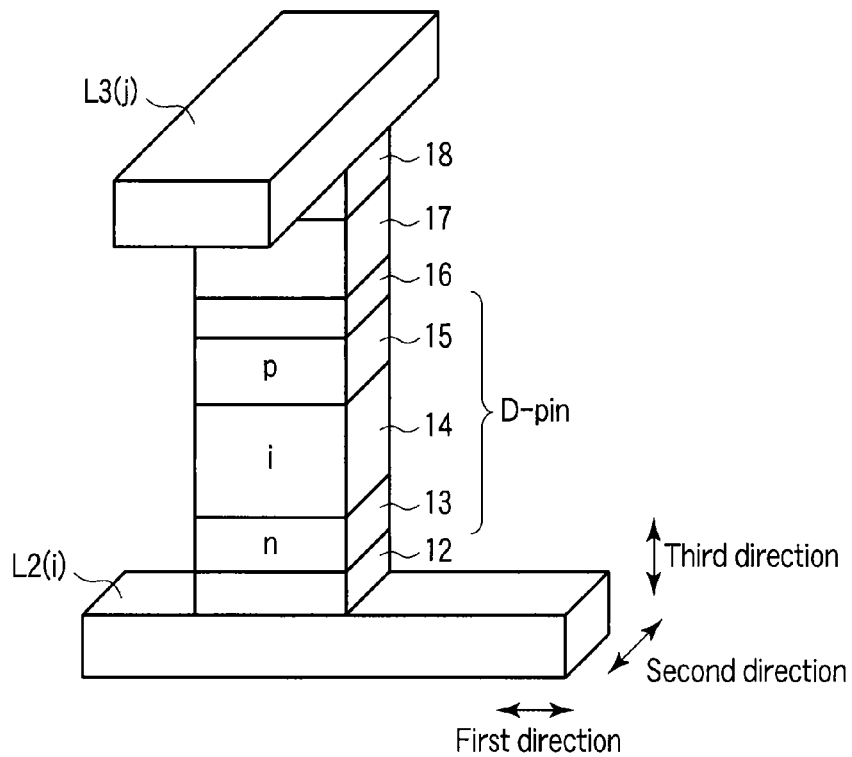
FIG. 10 illustrates a device structure of a p-i-n diode.

FIG. 10 illustrates a structure of the p-i-n diode.

Electrode layer 12, n-type semiconductor layer 13, intrinsic semiconductor layer 14, p-type semiconductor layer 15, and electrode layer 16 are stacked on conductive line L2(i) extended in the first direction. Intrinsic semiconductor layer 14 is a semiconductor layer in which an impurity is not doped or a semiconductor layer that contains a negligible trace of impurity with respect to intrinsic carrier density.

P-i-n diode D-pin comprises n-type semiconductor layer 13, intrinsic semiconductor layer 14, and p-type semiconductor layer 15.

Memory element 17, which is the variable resistive element or the phase-change element, and electrode layer 18 are stacked on electrode layer 16. Conductive line L3(j) is disposed on electrode layer 18, and extended in the second direction intersecting the first direction.

In p-i-n diode D-pin, in order to realize the set/reset operation, the reverse current of the p-i-n diode should be suppressed sufficiently in case of the reverse bias is applied during the set/rest operation.

Therefore, the thickness in the third direction of p-i-n diode D-pin is set to a range of 100 nm to 200 nm. For example, n-type semiconductor layer 13 is set to 15 nm, intrinsic semiconductor layer 14 is set to 120 nm, p-type semiconductor layer 15 is set to 15 nm, and the thickness of p-i-n diode D-pin is set to 150 nm.

However, in case of the resistance change memory, which is a next-generation memory, is manufactured by a rule of minimum line width of 30 nm or less, although a width of the trench formed after the processing of the rectifying element becomes 30 nm or less, a height of the trench (included the thickness of the memory element and electrode layer) exceeds 100 nm.

Therefore, the aspect ratio of the trench increases, which is disadvantageous as regards three-dimensional integration of cross-point type memory cell arrays.

For example, when the resistance change memory is manufactured by a rule of minimum line width of 30 nm or less, the thickness of the rectifying element (non-ohmic element) should be 100 nm or less in order to realize three-dimensional integration of the cross-point type memory cell array.

The following rectifying element realizes three-dimensional integration of the cross-point type memory cell array.

B. SIS Diode (a) Structure

Figure 11:
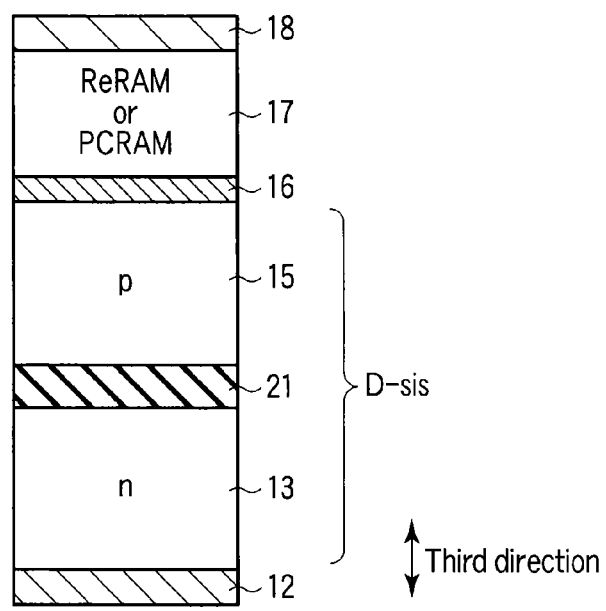
FIG. 11 illustrates a device structure of an SIS diode.

FIG. 11 illustrates a structure of an SIS diode.

SIS diode D-sis has a stacked structure of n-type semiconductor layer 13, insulating layer 21, and p-type semiconductor layer 15.

SIS diode D-sis is disposed on electrode layer 12, electrode layer 16 is disposed on SIS diode D-sis, memory element 17 is the variable resistive element (ReRAM) or the phase-change element (PCRAM) is disposed on electrode layer 16, and electrode layer 18 is disposed on memory element 17.

The positional relationship between the memory element and the rectifying element and the structures of the memory element and the rectifying element may be changed in various ways as long as the rectifying characteristic of the rectifying element is not lost. For example, the memory element and the rectifying element may be formed upside down, the cathode and anode of the rectifying element may be reversed, the electrode layer may be omitted or added, a barrier layer that suppresses diffusion of the impurity may be added, or a combination thereof may be performed.

A memory function of utilizing an insulating characteristic change caused by a trap or ion movement may be added to the insulating layer constituting the SIS diode.

One of the features of SIS diode D-sis is that the reverse current caused by the reverse bias can be sufficiently suppressed during the set/reset operation even if the thickness in the third direction of SIS diode D-sis is set to 100 nm or less.

For example, the thickness in the third direction of SIS diode D-sis is set to a range of 25 nm to 100 nm. For example, n-type semiconductor layer 13 is set to 15 nm, insulating layer 21 is set to 1 nm, and p-type semiconductor layer 15 is set to 15 nm, thereby setting the thickness of SIS diode D-sis to 31 nm.

The thickness of insulating layer 21 is determined based on the condition that a charge tunneling phenomenon (including both direct tunneling and FN (Fowler-Noldheim) tunneling) is generated between n-type semiconductor layer 13 and p-type semiconductor layer 15.

For example, when insulating layer 21 is made of $SiO_2$, the thickness of insulating layer 21 is set to a range of 0.1 to 3 nm. When insulating layer 21 is made of SiN or $Al_2O_3$, the thickness of insulating layer 21 is set to a range of 0.1 to 3 nm.

Insulating layer 21 may include an impurity atom or a semiconductor/metal dot (quantum dot), which forms a defect level. A fine rectifying element (non-ohmic element) that can be formed at a low temperature can be shrunk by the above structure.

Insulating layer 21 may be formed by a single layer or plural layers. In case of insulating layer 21 is formed by plural layers, preferably the layers have different barrier heights or different permittivities.

For example, it is assumed that insulating layer 21 is formed by insulating layers 21A and 21B having different barrier heights. For example, the insulating layer 21A is made of $SiO_2$ having a thickness of 0.5 nm while insulating layer 21B is made of $TiO_2$ having a thickness of 1 nm. In such cases, in case of a bias is not applied, the barrier height of insulating layer 21A is higher than that of insulating layer 21B.

In case of the forward bias is applied to the SIS diode, because electrons are only influenced by the thickness of insulating layer 21A, the charge movement is generated by the FN tunneling of insulating layer 21A, and the current passed through the SIS diode increases with increasing forward bias.

On the other hand, in case of the reverse bias is applied to the SIS diode, because electrons are influenced by the sum of thickness of insulating layers 21A and 21B, the charge is not tunneling through insulating layers 21A and 21B, and the current is not passed through the SIS diode.

For this example, the reverse current of the SIS diode can be sufficiently suppressed against the reverse bias. At the same time, a sufficiently large forward current (set/reset current) can be obtained with respect to the forward bias.

(b) Operation Mechanism

An operation mechanism of the SIS diode will be described.

FIGS. 12 to 13 illustrate a band structure of the SIS diode.

In case of the insulating layer is disposed between the p-type semiconductor layer and the n-type semiconductor layer, the SIS diode has the structure of FIG. 12 before band modulation, and has the structure of FIG. 13 after the band modulation.

However, the insulating layer is made of $SiO_2$ having a thickness of 1 nm.

In case of a voltage less than 1 V is applied as the forward bias to the SIS diode, as illustrated in FIG. 14, charge movement is generated by the direct tunneling of the insulating layer ($SiO_2$), and the current passed through the SIS diode increases with increasing forward bias.

In case of a voltage of 1 V or more is applied as the forward bias to the SIS diode, as illustrated in FIG. 15, charge movement is generated by the FN tunneling of the insulating layer ($SiO_2$), and the current passed through the SIS diode increases with increasing forward bias.

On the other hand, In case of a voltage less than 1 V is applied as the reverse bias to the SIS diode, as illustrated in FIG. 16, because there the carrier is not tunneling through the insulating layer ($SiO_2$), the current is not passed through the SIS diode.

For this example, the reverse current of the SIS diode can be sufficiently suppressed against the reverse bias of 1 V. At the same time, a sufficiently large forward current (set/reset current) can be obtained with respect to the forward bias of 1 V.

As the insulating layer is further thickened, the reverse bias characteristic can further be improved. That is, in applying the reverse bias, the reverse current decreases while the breakdown voltage increases as the insulating layer is thickened.

FIG. 17 illustrates a relationship between a bias direction and a current value.

The insulating layer is made of $SiO_2$ having a thickness of 0.5 nm (X of FIG. 17), 2 nm (Y of FIG. 17), and 3 nm (Z of FIG. 17).

As is clear from FIG. 17, when the insulating layer has a thickness of 0.5 nm, the current passed through the SIS diode can be suppressed against the reverse bias of about 0.8 V (A point of FIG. 17).

In case of the insulating layer has a thickness of 2 nm, the current is not passed through the SIS diode against the reverse bias of about 2 V (B point of FIG. 17). When the insulating layer has a thickness of 3 nm, the current passed through the SIS diode can be suppressed against the reverse bias of about 3 V (C point of FIG. 17). It is not necessary that the SIS diode be completely turned off in the reverse bias. It is only necessary to pass the current through the SIS diode such that a set or reset error, or a read error is not occurred in the non-selected memory cell. Considering this point, the insulating film may have a thickness of 0.5 nm or less even if the reverse bias of 0.8 V is applied to the SIS diode. Generally, because the reverse bias applied to the diode of the resistance change memory ranges from 0.8 V to 3 V (except for forming operation), the thickness of the insulating layer constituting the SIS diode ranges from 0.1 to 3 nm as described above.

Specifically, the thickness of the insulating layer is determined in consideration of the forward bias characteristic.

In case of the thickness of the insulating layer is 1 nm or less (except zero), the forward bias characteristics and the reverse bias characteristics of the SIS diode can be approximate to a line-symmetry to a current axis of I-V characteristics. In this case, the SIS diode may include an intrinsic semiconductor layer with 10 nm or less. As a result, it is possible to apply the bipolar operation to the resistance change memory.

Although the insulating layer is made of $SiO_2$ in the example, the same holds true for an insulating layer made of SiN or $Al_2O_3$.

(c) Embodiments

Figure 18:
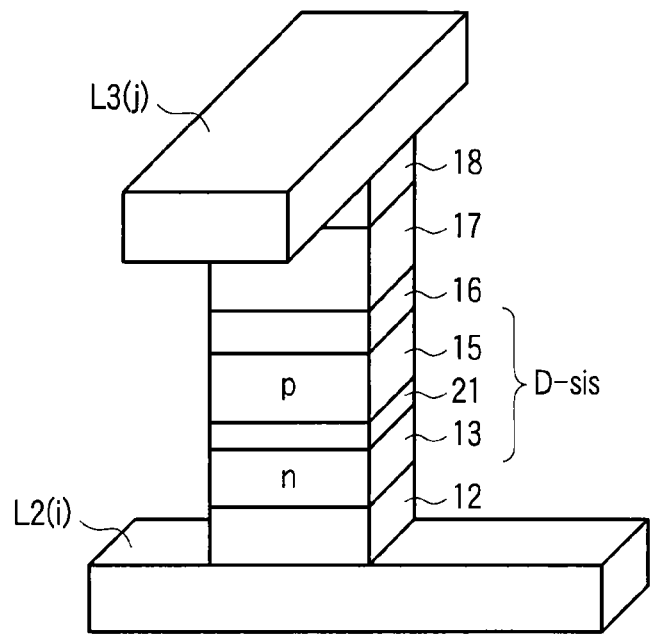
FIG. 18 illustrates an embodiment.

FIG. 18 illustrates a structure of the SIS diode.

Electrode layer 12, n-type semiconductor layer 13, insulating layer 21, p-type semiconductor layer 15, and electrode layer 16 are stacked on conductive line L2(i) extended in the first direction. SIS diode D-sis comprises n-type semiconductor layer 13, insulating layer 21, and p-type semiconductor layer 15.

Memory element 17, which is the variable resistive element or the phase-change element, and electrode layer 18 are stacked on electrode layer 16. Conductive line L3(j) is disposed on electrode layer 18, and extended in the second direction intersecting the first direction.

In SIS diode D-sis, in order to realize the set/reset operation, the reverse current of the SIS diode should be suppress sufficiently, in case of the reverse bias is applied during the set/reset operation.

Therefore, the thickness of SIS diode D-sis in the third direction is set to a range of 25 nm to 100 nm. For example, n-type semiconductor layer 13 is set to 15 nm, insulating layer 21 is set to 1 nm, and p-type semiconductor layer 15 is set to 15 nm, whereby the thickness of SIS diode D-sis becomes 31 nm.

Figure 19:
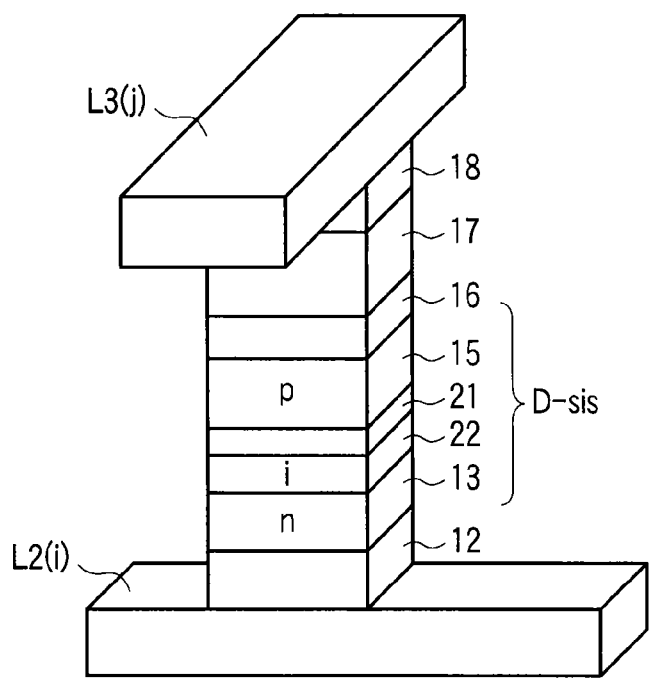

FIGS. 19 to 21 illustrate modifications of the SIS diode of FIG. 18.

The structure of the SIS diodes of the modifications differ from the structure of the SIS diode of FIG. 18 in that intrinsic semiconductor layer 22 is provided.

Specifically, in the modification of FIG. 19, intrinsic semiconductor layer 22 is disposed between n-type semiconductor layer 13 and insulating layer 21. In the modification of FIG. 20, intrinsic semiconductor layer 22 is disposed between insulating layer 21 and p-type semiconductor layer 15.

In the modification of FIG. 21, intrinsic semiconductor layers 22 are disposed between n-type semiconductor layer 13 and insulating layer 21 and between insulating layer 21 and p-type semiconductor layer 15.

The addition of intrinsic semiconductor layer 22 can further improve the reverse bias characteristic of the SIS diode. That is, the reverse bias characteristic can be suppressed within the permissible aspect ratio by the thickened intrinsic semiconductor layer and the thickened insulating film.

In case of the insulating layer 21 is thickened, the forward current is hardly passed, although the current can be considerably suppressed during the reverse bias. Therefore, in case of intrinsic semiconductor layer 22 is added while insulating layer 21 is thinned, the forward current can be increased, while the current is suppressed during the reverse bias.

(d) Material Example

A concrete example of the resistance change memory in which the SIS diode is used as the rectifying element will be described. The suffix x of WSix indicates any composition ratio.

The p-type semiconductor layer and the n-type semiconductor layer, which constitute the SIS diode, are selected from the group of Si, SiGe, SiC, Ge, C, a III-V semiconductor such as GaAs, a II-VI semiconductor such as ZnSe, an oxide semiconductor, a nitride semiconductor, a carbide semiconductor, and a sulfide semiconductor.

Preferably, the p-type semiconductor layer (anode layer) is one of p-type Si, $TiO_2$, $ZrO_2$, $InZnO_X$, ITO, $SnO_2$ containing Sb, ZnO containing Al, $AgSbO_3$, $InGaZnO_4$, $ZnO.SnO_2$, or a combination thereof.

Preferably, the n-type semiconductor layer (cathode layer) is one of n-type Si, $NiO_X$, ZnO, $Rh_2O_3$, ZnO containing N, $La_2CuO_4$, or a combination thereof.

For example, the insulating layer constituting the SIS diode is selected from the following materials.

A) Oxide $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, or a combination thereof.

$AB_2O_4$

Where A and B are identical or different elements and one of Al, Sc, Ti, V, Cr, Mn, Fe, Co, Ni, Cu, Zn, Ga, Ge, or a combination thereof.

For example, $Fe_3O_4$, $FeAl_2O_4$, $Mn_{1+x}Al_{2-x}O_{4+y}$, $Co_{1+x}Al_{2-x}O_{4+y}$, and $MnO_X$ $ABO_3$ Where A and B are identical or different elements and one of Ai, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, Sn, or a combination thereof.

For example, $LaAlO_3$, $SrHfO_3$, $SrZrO_3$, and $SrTiO_3$

B) Oxynitride

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON, or a combination thereof.

A material replaced some of the oxygen elements of the material in A) Oxide to a nitrogen element.

Particularly, the insulating layer constituting the SIS diode is preferably selected from the group of $SiO_2$, SiN, $Si_3N_4$, $Al_2O_3$, SiON, $HfO_2$, HfSiON, $Ta_2O_5$, $TiO_2$, and $SrTiO_3$.

The insulating layer includes an insulating layer that contains an impurity atom or a semiconductor/metal dot (quantum dot), which forms a defect level.

The conductive line that acts as the word line/bit line is made of W, WN, Al, Ti, V, Cr, Mn, Fe, Co, Ni, Cu, TiN, $WSi_X$, $TaSi_X$, $PdSi_X$, $ErSi_X$, $YSi_X$, $PtSi_X$, $HfSi_X$, $NiSi_X$, $CoSi_X$, $TiSi_X$, $VSi_X$, $CrSi_X$, $MhSi_X$, $FeSi_X$, or a combination thereof.

A single metal element or a mixture of metal elements, silicide, oxide, and nitride can be cited as an example of the material for the electrode layer. Specifically, the electrode layer is made of Pt, Au, Ag, TiAlN, SrRuO, Ru, RuN, Ir, Ti, V, Cr, Mn, Fe, Co, Ni, Cu, TiN, TaN, LaNiO, Al, $PtIrO_X$, $PtRhO_X$, Rh, TaAlN, $SiTiO_X$, $WSi_X$, $TaSi_X$, $PdSi_X$, $PtSi_X$, $IrSi_X$, $ErSi_X$, $YSi_X$, $HfSi_X$, $NiSi_X$, $CoSi_X$, $TiSi_X$, $VSi_X$, $CrSi_X$, $MnSi_X$, $FeSi_X$, or a combination thereof. The electrode layer may simultaneously have a function as a barrier metallic layer or a bonding layer.

For example, the memory element is made of a binary or ternary metal oxide or an organic material (including single-layer film and nanotube). For example, the carbon material includes a single-layer film, nanotube, and a two-dimensional structure such as graphene and fullerene. The metal oxide includes A) Oxide and B) Oxynitride.

(e) Effect

In case of the SIS diode is used as the rectifying element of the resistance change memory, the thickness of the rectifying element can be decreased to ½ to ⅓ that of the p-n junction diode and the p-i-n diode while the rectifying element has the sufficient rectifying characteristic. In other words, when the SIS diode has the same thickness as the p-n junction diode or the p-i-n diode, the reverse current of the SIS diode to which the reverse bias is applied decreases $10^2$ or more compared with the p-n junction diode or p-i-n diode, to which the identical reverse bias is applied.

Accordingly, a reduction of power consumption of the resistance change memory, improvement of operating speed, and ease of read can be realized.

As both the anode layer and cathode layer of the SIS diode are made of a semiconductor, the rectifying characteristic can be controlled by changing a Fermi level of the semiconductor. Particularly, in the forward bias, the Fermi level of the n-type semiconductor layer on the electron-injection side is relatively raised, and the Fermi level of the p-type semiconductor layer on the electron-reception side is relatively lowered, which allows an enhancement of the rectifying characteristic.

The SIS diode comprises plural insulating layers, and the insulating layers differ from each other in the barrier height or the permittivity. Therefore, an on/off-ratio of the SIS diode can be improved by the different barrier heights or permittivities of the insulating layers and the impurity concentrations of the p-type semiconductor layer and n-type semiconductor layer.

The on/off-ratio can also be improved by incorporating a trap level (a dot or a defect of the impurity or Si) in the single or plural insulating films asymmetrically.

Ultimately, the forward current can be significantly improved by greatly thinning the insulating film. Actually, the current characteristic can be improved by the use of an extremely-thin insulating film (with a thickness of less than 1 nm) made of SiOx, SiNx, TiOx, NiOx, WOx, and the like, which are formed by natural oxidation or marginal oxidation or nitridation by SPA.

As used herein, the on/off-ratio means a ratio (I-forward/I-reverse) of forward current I-forward and reverse current I-reverse in case of the forward bias is equal to the reverse bias in an absolute value.

C. MIS Diode (a) Structure

Figure 22:
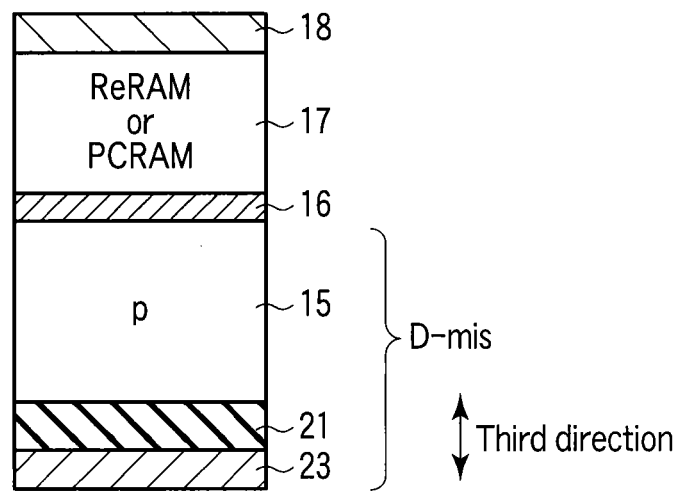
FIG. 22 illustrates a device structure of an MIS diode.

FIG. 22 illustrates a first example of a structure of the MIS diode.

MIS diode D-mis has a stacked structure of a p-type semiconductor layer 15, insulating layer 21, and metallic layer 23.

Electrode layer 16 is disposed on MIS diode D-mis, memory element 17 which is the variable resistive element (ReRAM) or the phase-change element (PCRAM) is disposed on electrode layer 16, and electrode layer 18 is disposed on memory element 17.

The positional relationship between the memory element and the rectifying element and the structures of the memory element and the rectifying element may be changed in various ways as long as the rectifying characteristic of the rectifying element is not lost. For example, the memory element and the rectifying element may be formed upside down, the cathode and anode of the rectifying element may be reversed, the electrode layer may be omitted or added, a barrier layer that suppresses diffusion of the impurity may be added, and a combination thereof may be performed.

The memory function of utilizing the insulating characteristic change caused by a trap or ion movement may be added to the insulating layer constituting the MIS diode.

One of the features of MIS diode D-mis is that the reverse current caused by the reverse bias can be sufficiently suppressed during the set/reset operation even if the thickness in the third direction of MIS diode D-mis is set to 100 nm or less.

For example, the thickness in the third direction of MIS diode D-mis is set to the range of 25 nm to 100 nm. For example, p-type semiconductor layer 15 is set to 15 nm, insulating layer 21 is set to 1 nm, and metallic layer 23 is set to 10 nm, whereby the thickness of MIS diode D-mis becomes as thin as 26 nm.

Metallic layer 23 is made of a material having a relatively small effective work function because the MIS structure is formed between metallic layer 23 and p-type semiconductor layer 15. Specifically, in case of the effective work function of metallic layer 23 becomes small, the Fermi level of metallic layer 23 is raised. The Fermi level of metallic layer 23 is set higher than that of p-type semiconductor layer 15.

The thickness of insulating layer 21 is determined based on the condition that the charge tunneling phenomenon (including both direct tunneling and FN tunneling) is generated between p-type semiconductor layer 15 and metallic layer 23.

For example, in case of insulating layer 21 is made of $SiO_2$, the thickness of insulating layer 21 is set to the range of 0.1 to 3 nm. In case of insulating layer 21 is made of SiN or $Al_2O_3$, the thickness of insulating layer 21 is set to the range of 0.1 to 3 nm.

Insulating layer 21 may include an impurity atom or semiconductor/metal dot (quantum dot), which forms the defect level. A fine rectifying element (non-ohmic element) that can be formed at a low temperature can be shrunk by the above structure.

Insulating layer 21 may be formed by a single layer or plural layers. In case of insulating layer 21 is formed by plural layers, preferably the layers have different barrier heights or different permittivities.

Figures 28, 29:
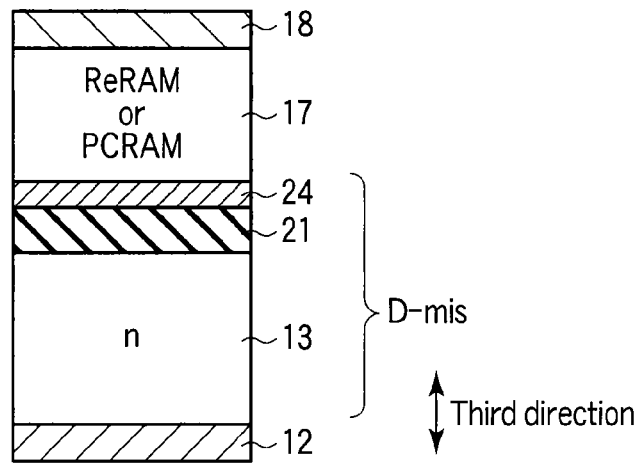
FIG. 28 illustrates a device structure of an MIS diode.
FIG. 29 illustrates an effective work function of metal.

FIG. 28 illustrates a second example of the structure of the MIS diode.

MIS diode D-mis has a stacked structure of metallic layer 24, insulating layer 21, and n-type semiconductor layer 13.

MIS diode D-mis is disposed on electrode layer 12, memory element 17 which is the variable resistive element (ReRAM) or the phase-change element (PCRAM) is disposed on MIS diode D-mis, and electrode layer 18 is disposed on memory element 17.

One of the features of MIS diode D-mis is that the reverse current caused by the reverse bias can be sufficiently suppressed during the set/reset operation even if the thickness in the third direction of MIS diode D-mis is set to 100 nm or less.

For example, the thickness in the third direction of MIS diode D-mis is set to the range of 25 nm to 55 nm. For example, metallic layer 24 is set to 10 nm, insulating layer 21 is set to 1 nm, and n-type semiconductor layer 13 is set to 15 nm, whereby the thickness of MIS diode D-mis becomes 26 nm.

Metallic layer 24 is made of a material having a relatively large effective work function because the MIS structure is formed between metallic layer 24 and n-type semiconductor layer 13. Specifically, in case of the effective work function of metallic layer 24 becomes large, the Fermi level of metallic layer 24 is lowered. The Fermi level of metallic layer 24 is set lower than that of n-type semiconductor layer 13. Alternatively, the p-type semiconductor layer may be used in case of the metallic layer is used as a hole supply source.

The thickness of insulating layer 21 is determined based on the condition that the charge tunneling phenomenon (including both direct tunneling and FN tunneling) is generated between metallic layer 24 and n-type semiconductor layer 13.

For example, in case of insulating layer 21 is made of $SiO_2$, the thickness of insulating layer 21 is set to the range of 0.1 to 3 nm. In case of insulating layer 21 is made of SiN or $Al_2O_3$, the thickness of insulating layer 21 is set to the range of 0.1 to 3 nm.

Insulating layer 21 may include an impurity atom or semiconductor/metal dot (quantum dot), which forms the defect level. A fine rectifying element (non-ohmic element) that can be formed at a low temperature can be shrunk by the above structure.

Insulating layer 21 may be formed by a single layer or plural layers. When insulating layer 21 is formed by plural layers, preferably the layers have different barrier heights or different permittivities.

(b) Operation Mechanism

A mechanism of operation of the MIS diode will be described by taking the structure of FIG. 22 as an example.

Figure 23:
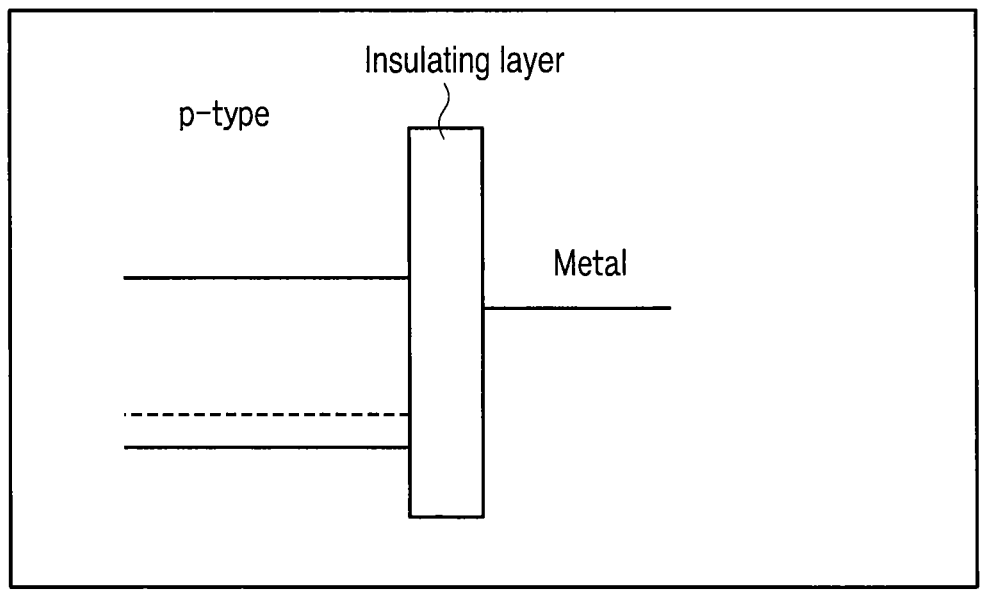

FIGS. 23 and 24 illustrate a band structure of the MIS diode.

In case of the insulating layer is disposed between the p-type semiconductor layer and the metallic layer, the MIS diode has the structure of FIG. 23 before the band modulation, and has the structure of FIG. 24 after the band modulation.

However, the Fermi level of the metallic layer is higher than that of p-type semiconductor layer 15. For example, the insulating layer is made of $SiO_2$ having a thickness of 1 nm.

In case of a voltage less than 1 V is applied as the forward bias to the MIS diode, as illustrated in FIG. 25, charge movement is generated by the direct tunneling of the insulating layer ($SiO_2$), and the current passed through the MIS diode increases with increasing forward bias.

In case of a voltage of 1 V or more is applied as the forward bias to the MIS diode, as illustrated in FIG. 26, charge movement is generated by the FN tunneling of the insulating layer ($SiO_2$), and the current passed through the MIS diode increases with increasing forward bias.

On the other hand, in case of a voltage less than 1 V is applied as the reverse bias to the MIS diode, as illustrated in FIG. 27, because the carrier is not tunneling through the insulating layer ($SiO_2$), the current is not passed through the MIS diode.

For this example, the reverse current of the MIS diode can be sufficiently suppressed against the reverse bias of 1 V. At the same time, a sufficiently large forward current (set/reset current) can be obtained with respect to the forward bias of 1 V.

As the insulating layer is further thickened, the reverse bias characteristic can be further improved. That is, in applying the reverse bias, the reverse current decreases while the breakdown voltage increases as the insulating layer is thickened.

However, as described above with reference to FIG. 17, because the reverse bias applied to the diode of the resistance change memory generally ranges from 0.8 V to 3 V (except for the forming operation), the thickness of the insulating layer constituting the MIS diode ranges from 0.1 to 3 nm.

Specifically, the thickness of the insulating layer is determined in consideration of the forward bias characteristic.

FIG. 29 illustrates a table of effective work functions of metallic materials.

As to the relationship between the effective work function and the Fermi level, the Fermi level is raised in case of the effective work function becomes small, and the Fermi level is lowered in case of the effective work function becomes large.

In the operation, in the MIS diode of FIG. 22, the Fermi level of the metallic layer should be set higher than that of the p-type semiconductor layer. In the MIS diode of FIG. 28, the Fermi level of the metallic layer should be lower than that of the n-type semiconductor layer.

Therefore, the metal satisfying the condition mentioned above is selected from the materials of FIG. 29.

(c) Embodiments

Figure 30:
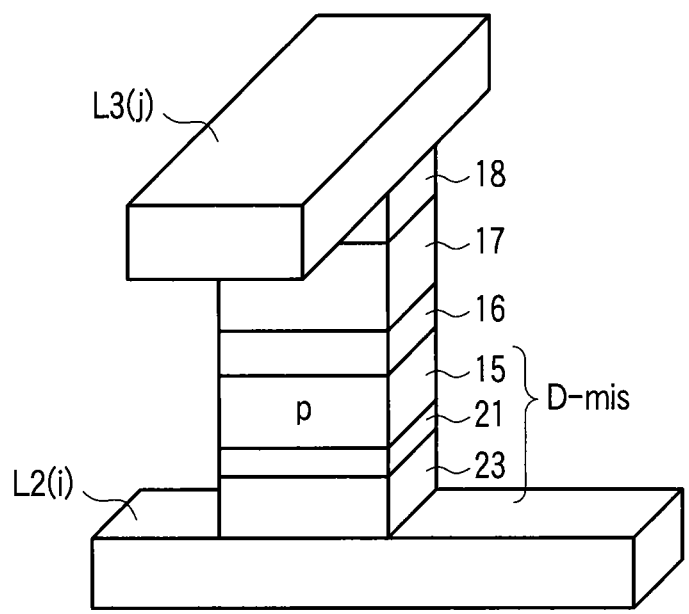
FIG. 30 illustrates an embodiment.

FIG. 30 illustrates a first example of the structure of the MIS diode.

The structure of FIG. 30 corresponds to the MIS diode of FIG. 22.

Metallic layer (electrode layer) 23, insulating layer 21, p-type semiconductor layer 15, and electrode layer 16 are stacked on conductive line L2(i) extended in the first direction. MIS diode D-mis comprises metallic layer 23, insulating layer 21, and p-type semiconductor layer 15.

Memory element 17, which is the variable resistive element or the phase-change element, and electrode layer 18 are stacked on electrode layer 16. Conductive line L3(j) is disposed on electrode layer 18, and extended in the second direction intersecting the first direction. That is, electrode layer 12 of FIG. 10 is used as metallic layer 23 of the MIS diode. As a result, the height of memory cell MC can be further decreased.

In MIS diode D-mis, in order to realize the set/reset operation, the reverse current of the MIS diode should be sufficiently suppressed to the reverse bias applied during the set/reset operation.

Therefore, the thickness in the third direction of MIS diode D-mis is set to the range of 25 nm to 100 nm. For example, metallic layer 23 is set to 10 nm, insulating layer 21 is set to 1 nm, and p-type semiconductor layer 15 is set to 15 nm, whereby the thickness of MIS diode D-mis becomes 26 nm.

Figure 31:
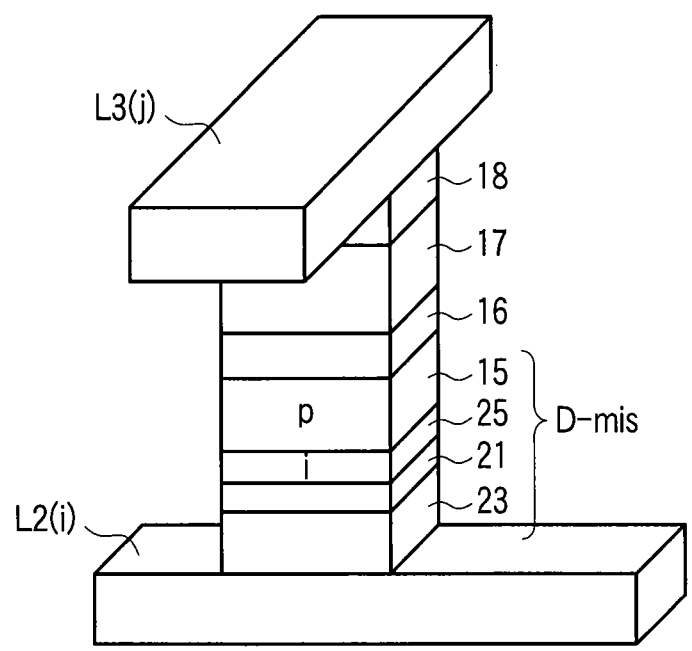
FIG. 31 illustrates a modification.

FIG. 31 illustrates a modification of the MIS diode of FIG. 30.

The structure of the MIS diode of the modification differs from the structure of the MIS diode of FIG. 30 in that intrinsic semiconductor layer 25 is provided. Specifically, in the modification of FIG. 30, intrinsic semiconductor layer 25 is disposed between insulating layer 21 and p-type semiconductor layer 15.

The addition of intrinsic semiconductor layer 25 can further improve the reverse bias characteristic of the MIS diode. That is, the reverse bias characteristic can be suppressed within the permissible aspect ratio by the thickened intrinsic semiconductor layer and the thickened insulating film.

In case of insulating layer 21 is thickened, the forward current is hardly passed although the current can be considerably suppressed during the reverse bias. Therefore, in case of intrinsic semiconductor layer 25 is added while insulating layer 21 is thinned, the forward current can be increased while the current is suppressed during the reverse bias.

For example, the P-type semiconductor layer is set to 5 nm, the intrinsic semiconductor layer is set to about 60 nm, and the insulating layer is made of an extremely-thin (1 nm or less) SiN having a low barrier height. Therefore, even if the metal layer is set to 10 nm, because the sum of the layers becomes about 75 nm, the reverse current can be suppressed by the effect of the intrinsic semiconductor while the current is increased.

FIG. 32 illustrates a second example of the structure of the MIS diode.

The structure of FIG. 32 corresponds to the MIS diode of FIG. 28.

Electrode layer 12, n-type semiconductor layer 13, insulating layer 21, and metallic layer (electrode layer) 24 are stacked on conductive line L2(i) extended in the first direction. MIS diode D-mis comprises n-type semiconductor layer 13, insulating layer 21, and metallic layer 24. That is, electrode layer 16 of FIG. 10 is used as metallic layer 24 of the MIS diode. As a result, the height of memory cell MC can be further decreased.

Memory element 17, which is the variable resistive element or the phase-change element, and electrode layer 18 are stacked on MIS diode D-mis. Conductive line L3(j) is disposed on electrode layer 18, and extended in the second direction intersecting the first direction.

In MIS diode D-mis, in order to realize the set/reset operation, the reverse current of the MIS diode should be sufficiently suppressed to the reverse bias applied during the set/reset operation.

Therefore, the thickness in the third direction of MIS diode D-mis is set to the range of about 20 nm to about 100 nm. For example, n-type semiconductor layer 13 is set to 15 nm, insulating layer 21 is set to 1 nm, and metallic layer 24 is set to 10 nm, whereby the thickness of MIS diode D-mis becomes 26 nm.

FIG. 33 illustrates a modification of the MIS diode of FIG. 32.

The structure of the MIS diode of the modification differs from the structure of the MIS diode of FIG. 32 in that intrinsic semiconductor layer 25 is provided. Specifically, in the modification of FIG. 33, intrinsic semiconductor layer 25 is disposed between insulating layer 21 and n-type semiconductor layer 13.

The addition of intrinsic semiconductor layer 25 can further improve the reverse bias characteristic of the MIS diode. That is, the reverse bias characteristic can be suppressed within the permissible aspect ratio by the thickened intrinsic semiconductor layer and the thickened insulating film.

In case of insulating layer 21 is thickened, the forward current is hardly passed although the current can be considerably suppressed during the reverse bias. Therefore, in case of intrinsic semiconductor layer 25 is added while insulating layer 21 is thinned, the forward current can be increased while the current is suppressed during the reverse bias.

For example, the P-type semiconductor layer is set to 5 nm, intrinsic semiconductor layer is set to about 60 nm, and the insulating layer is made of an extremely-thin (1 nm or less) SiN having a low barrier height. Therefore, even if the metal layer is set to 10 nm, because the sum of the layers becomes about 75 nm, the reverse current can be suppressed by the effect of the intrinsic semiconductor while the current is increased.

(d) Material Example

A material example for the resistance change memory in which the MIS diode is used as the rectifying element will be described.

The p-type semiconductor layer and the n-type semiconductor layer, which constitute the MIS diode, are selected from the group of Si, SiGe, SiC, Ge, C, GaAs, an oxide semiconductor, a nitride semiconductor, a carbide semiconductor, and a sulfide semiconductor.

Preferably, the p-type semiconductor layer (anode layer) is one of p-type Si, $TiO_2$, $ZrO_2$, $InZnO_X$, ITO, $SnO_2$ containing Sb, ZnO containing Al, $AgSbO_3$, $InGaZnO_4$, and $ZnO.SnO_2$.

Preferably, the n-type semiconductor layer (cathode layer) is one of n-type Si, $NiO_X$, ZnO, $Rh_2O_3$, ZnO containing N, and $La_2CuO_4$.

For example, the insulating layer constituting the MIS diode is selected from the following materials.

A) Oxide $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, or a combination thereof.

$AB_2O_4$

Where A and B are identical or different elements and one of Al, Sc, Ti, V, Cr, Mn, Fe, Co, Ni, Cu, Zn, Ga, Ge, or a combination thereof.

For example, $Fe_3O_4$, $FeAl_2O_4$, $Mn_{1+x}Al_{2-x}O_{4+y}$, $Co_{1+x}Al_{2-x}O_{4+y}$, and $MnO_X$ $ABO_3$ Where A and B are identical or different elements and one of Ai, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, Sn, or a combination thereof.

For example, $LaAlO_3$, $SrHfO_3$, $SrZrO_3$, and $SrTiO_3$

B) Oxynitride

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON, or a combination thereof.

A material replaced some of the oxygen elements of the material in A) Oxide to a nitrogen element.

Particularly, the insulating layer constituting the MIS diode is preferably selected from the group of $SiO_2$, SiN, $Si_3N_4$, $Al_2O_3$, SiON, $HfO_2$, HfSiON, $Ta_2O_5$, $TiO_2$, and $SrTiO_3$.

Particularly, for the insulating layer made of an Si-based material such as $SiO_2$, SiN, and SiON, each of the oxygen element and the nitrogen element has a concentration of $1\times10^{18}$ atoms/cm$^3$ or more.

The insulating layer includes an insulating layer that contains an impurity atom or semiconductor/metal dot (quantum dot), which forms the defect level.

The conductive line that acts as the word line/bit line is made of W, WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MhSi_x$, $FeSi_x$, or a combination thereof.

A single metal element or a mixture of metal elements, silicide, oxide, and nitride can be cited as an example of the material for the electrode layer. Specifically, the electrode layer is made of Pt, Au, Ag, TiAlN, SrRuO, Ru, RuN, Ir, Ti, V, Cr, Mn, Fe, Co, Ni, Cu, TiN, TaN, LaNiO, Al, $PtIrO_x$, $PtRhO_x$, Rh, TaAlN, $SiTiO_x$, $WSi_x$, $TaSi_x$, $PdSi_x$, $PtSi_x$, $IrSi_x$, $ErSi_x$, $YSi_x$, $HfSi_x$, $NiSi_x$, $CoSi_x$, $TiSi_x$, $VSi_x$, $CrSi_x$, $MnSi_x$, $FeSi_x$, or a combination thereof. The electrode layer may simultaneously have a function as a barrier metallic layer or a bonding layer.

However, the electrode layer includes the metallic layer constituting the MIS diode (the electrode layer may also be used as the metallic layer).

The metallic layer constituting the MIS diode is made of one of the following materials or a combination thereof:

A) A single metal element or a mixture of metal elements,

B) Compound metal that is an oxide, carbide, boride, nitride, or silicide, and

C) One or a combination of $TiN_x$, $TiC_x$, $TiB_x$, $TiSi_x$, $TaC_x$, $TaB_x$, $TaN_x$, $WC_x$, $WB_x$, W, $WSi_x$, $TaC_x$, TaB, $TaN_x$, $TaSi_x$, $LaB_x$, $LaN_x$, $LaSi_x$, $HfSi_x$, Hf, $YSi_x$, ErSi, NiSi, $NiSi_x$, $PtSi_x$, $PdSi_x$, $CoSi_x$, $MnSi_x$, $CrSi_x$, and $FeSi_x$.

For example, the memory element is made of a binary or ternary metal oxide or an organic material.

(e) Effect

In case of the MIS diode is used as the rectifying element of the resistance change memory, the thickness of the rectifying element can be decreased to $1/3$ to $1/5$ that of the p-n junction diode and the p-i-n diode while maintaining the rectifying characteristic. In other words, in case of the MIS diode is set to the same thickness as the p-n junction diode or the p-i-n diode, the reverse current of the MIS diode to which the reverse bias is applied decreases $10^3$ or more compared with the p-n junction diode or the p-i-n diode, to which the identical reverse bias is applied.

Accordingly, a reduction of the power consumption of the resistance change memory, improvement in the operating speed, and ease of read can be realized.

One of the anode layer and cathode layer of the MIS diode is made of a metal while the other is made of a semiconductor, so that the rectifying characteristic can be controlled by adjusting the effective work function (Fermi level) of the metal and the Fermi level of the semiconductor.

Particularly, in case of the cathode layer is made of a metal, in the forward bias, the Fermi level of the metallic layer on the electron-injection side is relatively raised, and the Fermi level of the p-type semiconductor layer on the electron-reception side is relatively lowered, which allows the rectifying characteristic to be enhanced.

Particularly, in case of the anode layer is made of a metal, in the forward bias, the Fermi level of the metallic layer on the electron-injection side is relatively raised, and the Fermi level of the n-type semiconductor layer on the electron-reception side is relatively lowered, which allows the rectifying characteristic to be enhanced.

In the p-i-n diode, in case of the minimum line width becomes 30 nm or less, unfortunately a variation in characteristic is generated by a variation in impurity concentration of the semiconductor layer. On the other hand, in the MIS diode, the variation in characteristic is reduced because one of the anode layer and the cathode layer is made of a metal.

In the MIS diode, one (metallic layer side) of the anode layer and the cathode layer is only considered for the depletion of the semiconductor layer, which contributes to a thinned diode.

The MIS diode comprises plural insulating layers, and the insulating layers differ from each other in the barrier height or the permittivity. Therefore, the on/off-ratio of the MIS diode can be improved by the different barrier heights or permittivities of the insulating layers and the impurity concentrations of the p-type semiconductor layer and n-type semiconductor layer.

The on/off-ratio can also be improved by incorporating the trap level (a dot or a defect of an impurity or Si) in the single or plural insulating films asymmetrically.

Ultimately, the forward current can be significantly improved by extremely thinning the insulating film. Actually the current characteristic can be improved by the use of an extremely-thin insulating film made of $SiO_x$, $SiN_x$, $TiO_x$, $NiO_x$, $WO_x$, and the like, which are formed by natural oxidation or SPA.

D. SMIS Diode (a) Structure

FIG. 34 illustrates a first example of a structure of the SMIS diode.

SMIS diode D-smis has a stacked structure of p-type semiconductor layer 15, insulating layer 21, metallic layer 23, and n-type semiconductor layer 13.

SMIS diode D-smis is disposed on electrode layer 12, electrode layer 16 is disposed on SMIS diode D-smis, memory element 17 which is the variable resistive element (ReRAM) or the phase-change element (PCRAM) is disposed on electrode layer 16, and electrode layer 18 is disposed on memory element 17.

The positional relationship between the memory element and the rectifying element and the structures of the memory element and the rectifying element may be changed in various ways as long as the rectifying characteristic of the rectifying element is not lost. For example, the memory element and the rectifying element may be formed upside down, the cathode and anode of the rectifying element may be reversed, the electrode layer may be omitted or added, a barrier layer that suppresses diffusion of the impurity may be added, or a combination thereof may be performed.

The memory function of utilizing the insulating characteristic change caused by a trap or ion movement may be added to the insulating layer constituting the SMIS diode.

One of the features of SMIS diode D-smis is that the reverse current caused by the reverse bias can be sufficiently suppressed during the set/reset operation even if the thickness in the third direction of SMIS diode D-smis is set to 100 nm or less.

For example, the thickness in the third direction of SMIS diode D-smis is set to the range of 35 nm to 100 nm. For example, p-type semiconductor layer 15 is set to 15 nm, insulating layer 21 is set to 1 nm, and metallic layer 23 is set to 10 nm, whereby the thickness of SMIS diode D-smis becomes 41 nm.

Metallic layer 23 is made of a material having a relatively small effective work function because the MIS structure is formed between metallic layer 23 and p-type semiconductor layer 15. Specifically, when the effective work function of metallic layer 23 becomes small, the Fermi level of metallic layer 23 is raised. The Fermi level of metallic layer 23 is set higher than that of p-type semiconductor layer 15.

The thickness of insulating layer 21 is determined based on the condition that the charge tunneling phenomenon (including both direct tunneling and FN tunneling) is generated between p-type semiconductor layer 15 and metallic layer 23.

For example, in case of insulating layer 21 is made of $SiO_2$, the thickness of insulating layer 21 is set to the range of 0.1 to 3 nm. In case of insulating layer 21 is made of SiN or $Al_2O_3$, the thickness of insulating layer 21 is set to the range of 0.1 to 3 nm.

Insulating layer 21 may include an impurity atom or semiconductor/metal dot (quantum dot), which forms the defect level. A fine rectifying element (non-ohmic element) that can be formed at a low temperature can be shrunk by the above structure.

Insulating layer 21 may be formed by a single layer or plural layers. In case of insulating layer 21 is formed by plural layers, preferably the layers have different barrier heights or different permittivities.

Figure 40:
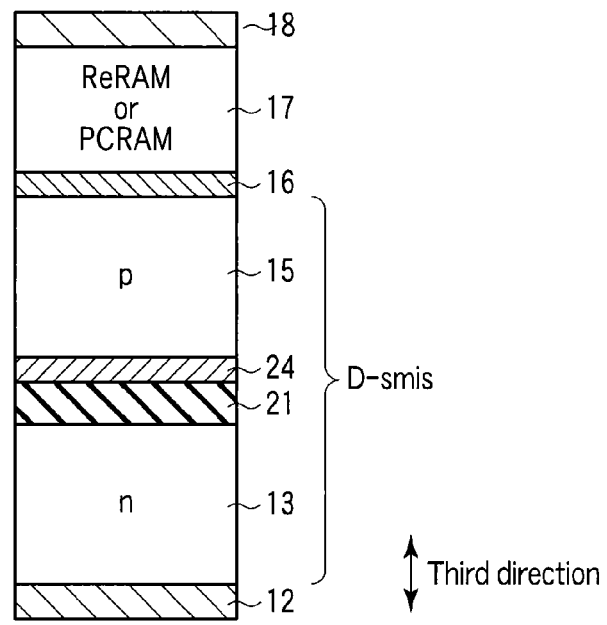
FIG. 40 illustrates a device structure of an SMIS diode.

FIG. 40 illustrates a second example of the structure of the SMIS diode.

SMIS diode D-smis has a stacked structure of p-type semiconductor layer 15, metallic layer 24, insulating layer 21, and n-type semiconductor layer 13.

SMIS diode D-smis is disposed on electrode layer 12, electrode layer 16 is disposed on SMIS diode D-smis, memory element 17 which is the variable resistive element (ReRAM) or the phase-change element (PCRAM) is disposed on electrode layer 16, and electrode layer 18 is disposed on memory element 17.

One of the features of SMIS diode D-smis is that the reverse current caused by the reverse bias can be sufficiently suppressed during the set/reset operation even if the thickness in the third direction of SMIS diode D-smis is set to 100 nm or less.

For example, the thickness in the third direction of SMIS diode D-smis is set to the range of 35 nm to 80 nm. For example, p-type semiconductor layer 15 is set to 15 nm, metallic layer 24 is set to 10 nm, insulating layer 21 is set to 1 nm, and n-type semiconductor layer 13 is set to 15 nm, whereby the thickness of SMIS diode D-smis becomes 41 nm.

Metallic layer 24 is made of a material having a relatively large effective work function because the MIS structure is formed between metallic layer 24 and n-type semiconductor layer 13. Specifically, in case of the effective work function of metallic layer 24 becomes large, the Fermi level of metallic layer 24 is lowered. The Fermi level of metallic layer 24 is set lower than that of n-type semiconductor layer 13.

The thickness of insulating layer 21 is determined based on the condition that the charge tunneling phenomenon (including both direct tunneling and FN tunneling) is generated between metallic layer 24 and n-type semiconductor layer 13.

For example, in case of insulating layer 21 is made of $SiO_2$, the thickness of insulating layer 21 is set to the range of 0.5 to 3 nm. In case of insulating layer 21 is made of SiN or $Al_2O_3$, the thickness of insulating layer 21 is set to the range of 0.1 to 3 nm.

Insulating layer 21 may include an impurity atom or semiconductor/metal dot (quantum dot), which forms the defect level. A fine rectifying element (non-ohmic element) that can be formed at a low temperature can be shrunk by the above structure.

Insulating layer 21 may be formed by a single layer or plural layers. When insulating layer 21 is formed by plural layers, preferably the layers have different barrier heights or different permittivities.

(b) Operation Mechanism

An operation mechanism of the SMIS diode will be described by taking the structure of FIG. 34 as an example.

FIGS. 35 and 36 illustrate a band structure of the SMIS diode.

In case of the insulating layer is disposed between the p-type semiconductor layer and the metallic layer to bring the n-type semiconductor layer into contact with the metallic layer, the SMIS diode has the structure of FIG. 35 before the band modulation, and has the structure of FIG. 36 after the band modulation.

However, the Fermi level of the metallic layer is higher than that of p-type semiconductor layer 15. It is assumed that the insulating layer is made of $SiO_2$ having a thickness of 1 nm.

In case of a voltage less than 1 V is applied as the forward bias to the SMIS diode, as illustrated in FIG. 37, charge movement is generated by the direct tunneling of the insulating layer ($SiO_2$), and the current passed through the SMIS diode increases with an increasing forward bias.

Figure 38:
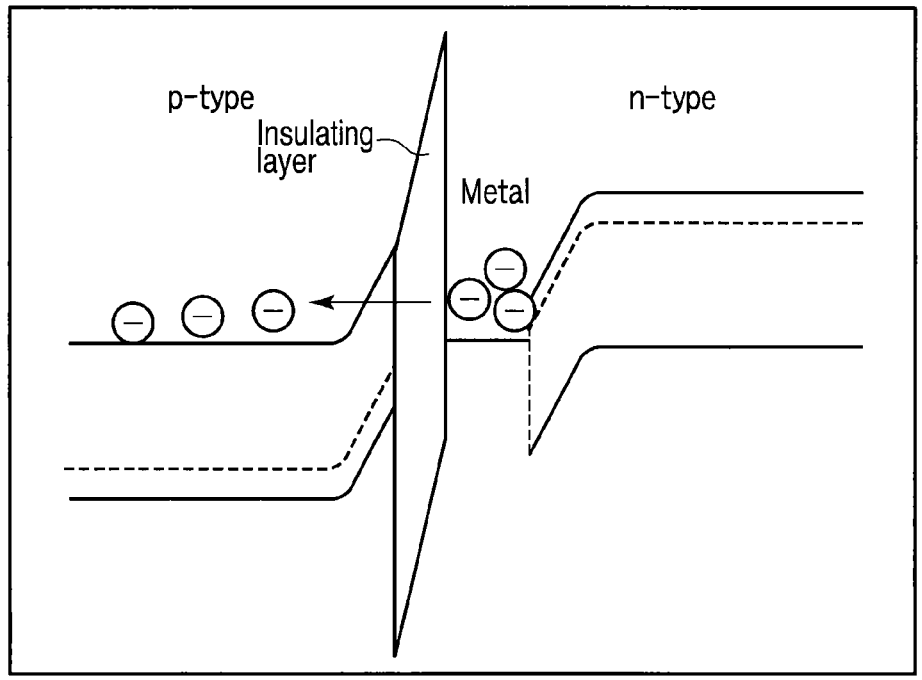

In case of a voltage of 1 V or more is applied as the forward bias to the SMIS diode, as illustrated in FIG. 38, charge movement is generated by the FN tunneling of the insulating layer ($SiO_2$), and the current passed through the SMIS diode increases with an increasing forward bias.

Figure 39:
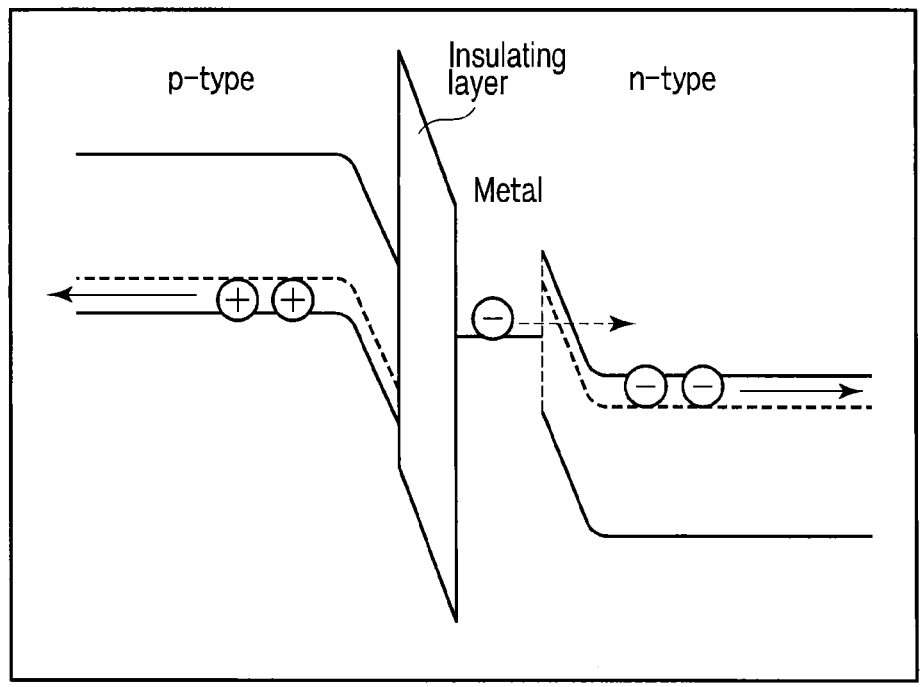
FIG. 39 illustrates an operation during a reverse bias.

On the other hand, in case of a voltage less than 1 V is applied as the reverse bias to the SMIS diode, as illustrated in FIG. 39, because the carrier is not tunneling through the insulating layer ($SiO_2$), the current is not passed through the SMIS diode.

For this example, the reverse current of the SMIS diode can be sufficiently suppressed against the reverse bias of 1 V. At the same time, a sufficiently large forward current (set/reset current) can be obtained with respect to the forward bias of 1 V.

As the insulating layer is further thickened, the reverse bias characteristic can further be improved. That is, in applying the reverse bias, the reverse current decreases while the breakdown voltage increases as the insulating layer is thickened.

However, as described above with reference to FIG. 17, because the reverse bias applied to the diode of the resistance change memory generally ranges from 0.8 V to 3 V (except for the forming operation), the thickness of the insulating layer constituting the SMIS diode ranges from 0.1 to 3 nm.

Specifically, the thickness of the insulating layer is determined in consideration of the forward bias characteristic.

As described above with reference to FIG. 29, the Fermi level of the metallic layer should be higher than that of the p-type semiconductor layer in the SMIS diode of FIG. 34, and that the Fermi level of the metallic layer should be lower than that of the n-type semiconductor layer in the SMIS diode of FIG. 40.

Therefore, a metal satisfying the condition is selected from the materials of FIG. 29.

Figure 41:
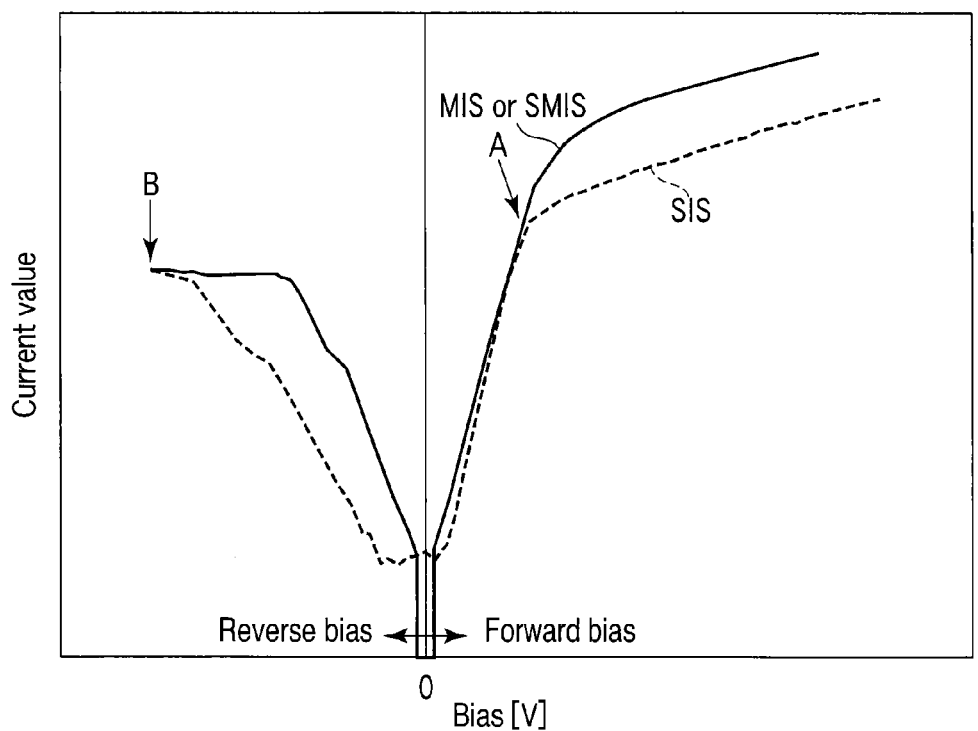
FIG. 41 illustrates a relationship between a bias and a current value.

FIG. 41 illustrates a relationship between a bias direction and a current value.

At this point, the MIS/SMIS diode characteristic and the SIS diode characteristic are compared to each other.

As to the forward bias characteristic, the forward current passed through the MIS/SMIS diode is larger than the forward current passed through the SIS diode for the bias of 1 V (point A of FIG. 41) or more.

As to the reverse bias characteristic, the reverse current passed through the MIS/SMIS diode is substantially equal to the reverse current passed through the SIS diode for the bias of 3 V (point B of FIG. 41) or more.

Accordingly, in the MIS/SMIS diode, the forward current characteristic can be improved without degrading the reverse bias characteristic by adjusting the bias applied to the MIS/SMIS diode.

In case of the thickness of the insulating layer is 1 nm or less (except zero), the forward bias characteristics and the reverse bias characteristics of the SIS diode can be approximate to a line-symmetry to a current axis of I-V characteristics. In this case, the SIS diode may include an intrinsic semiconductor layer with 10 nm or less. As a result, the bipolar operation is applied to the resistance change memory operating.

(c) Embodiments

FIG. 42 illustrates a first example of the structure of the SMIS diode.

The structure of FIG. 42 corresponds to the SMIS diode of FIG. 34.

Electrode layer 12, n-type semiconductor layer 13, metallic layer 23, insulating layer 21, p-type semiconductor layer 15, and electrode layer 16 are stacked on conductive line L2(i) extended in the first direction. SMIS diode D-smis comprises n-type semiconductor layer 13, metallic layer 23, insulating layer 21, and p-type semiconductor layer 15.

Memory element 17, which is the variable resistive element or the phase-change element, and electrode layer 18 are stacked on electrode layer 16. Conductive line L3(j) is disposed on electrode layer 18, and extended in the second direction intersecting the first direction.

In SMIS diode D-smis, in order to realize the set/reset operation, the reverse current of the SMIS diode should be sufficiently suppressed the reverse bias applied during the set/reset operation.

Therefore, the thickness in the third direction of SMIS diode D-smis is set to the range of 35 nm to 80 nm. For example, n-type semiconductor layer 13 is set to 15 nm, metallic layer 23 is set to 10 nm, insulating layer 21 is set to 1 nm, and p-type semiconductor layer 15 is set to 15 nm, whereby the thickness of SMIS diode D-smis becomes 41 nm.

FIG. 43 illustrates a modification of the SMIS diode of FIG. 42.

The structure of the SMIS diode of the modification differs from the structure of the SMIS diode of FIG. 42 in that intrinsic semiconductor layer 25 is provided. Specifically, in the modification of FIG. 43, intrinsic semiconductor layer 25 is disposed between insulating layer 21 and p-type semiconductor layer 15.

The addition of intrinsic semiconductor layer 25 can further improve the reverse bias characteristic of the SMIS diode.

Figure 44:
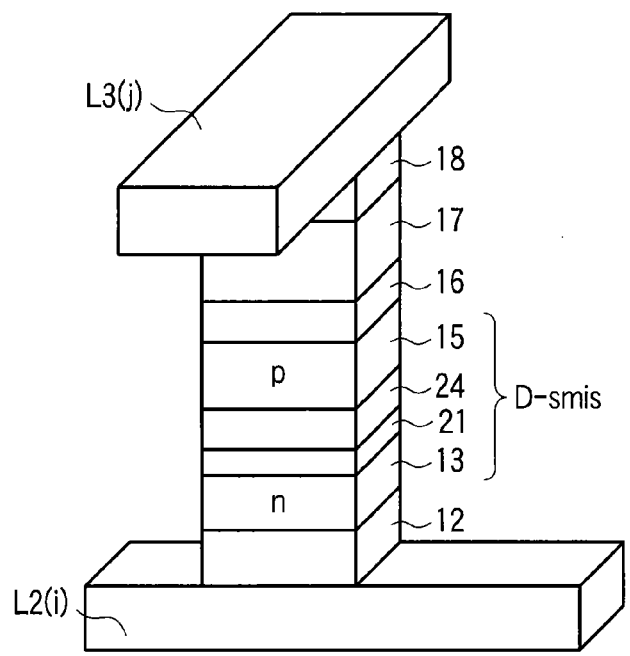
FIG. 44 illustrates an embodiment.

FIG. 44 illustrates a second example of the structure of the SMIS diode.

The structure of FIG. 44 corresponds to the SMIS diode of FIG. 40.

Electrode layer 12, n-type semiconductor layer 13, insulating layer 21, metallic layer 24, p-type semiconductor layer 15, and electrode layer 16 are stacked on conductive line L2(i) extended in the first direction. SMIS diode D-smis comprises n-type semiconductor layer 13, insulating layer 21, metallic layer 24, and p-type semiconductor layer 15.

Memory element 17 which is the variable resistive element or the phase-change element and electrode layer 18 are stacked on electrode layer 16. Conductive line L3(j) is disposed on electrode layer 18, and extended in the second direction intersecting the first direction.

In SMIS diode D-smis, in order to realize the set/reset operation, the reverse current of the SMIS diode should be sufficiently suppressed to the reverse bias applied during the set/reset operation.

Therefore, the thickness in the third direction of SMIS diode D-smis is set to the range of 35 nm to 80 nm. For example, n-type semiconductor layer 13 is set to 15 nm, insulating layer 21 is set to 1 nm, metallic layer 24 is set to 10 nm, and p-type semiconductor layer 15 is set to 15 nm, whereby the thickness of SMIS diode D-smis becomes 41 nm.

Figure 45:
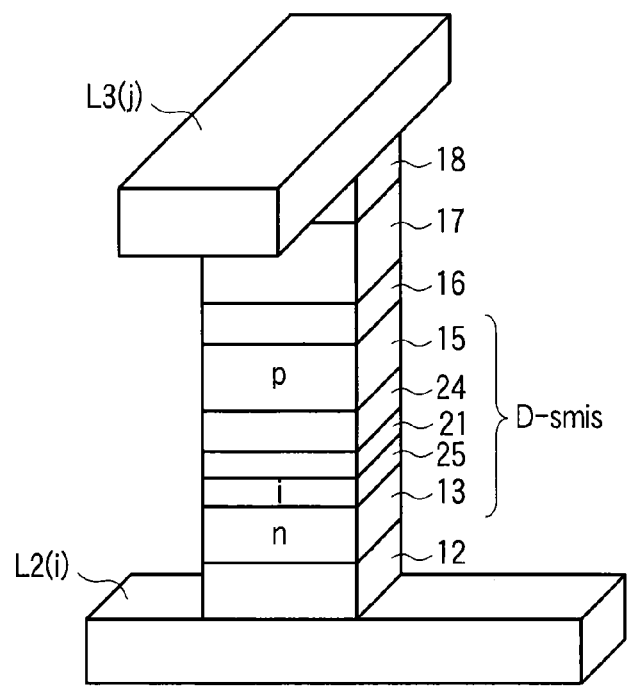
FIG. 45 illustrates a modification.

FIG. 45 illustrates a modification of the SMIS diode of FIG. 44.

The structure of the SMIS diode of the modification differs from the structure of the SMIS diode of FIG. 44 in that intrinsic semiconductor layer 25 is provided. Specifically, in the modification of FIG. 44, intrinsic semiconductor layer 25 is disposed between insulating layer 21 and n-type semiconductor layer 13.

The addition of intrinsic semiconductor layer 25 can further improve the reverse bias characteristic of the SMIS diode. That is, the reverse bias characteristic can be suppressed within the permissible aspect ratio by the thickened intrinsic semiconductor layer and the thickened insulating film.

In case of insulating layer 21 is thickened, the forward current is hardly passed although the current can be considerably suppressed during the reverse bias. Therefore, in case of intrinsic semiconductor layer 25 is added while insulating layer 21 is thinned, the forward current can be gained while the current is suppressed during the reverse bias.

In addition to the MIS diode, a Schottky diode (including an ohmic junction) may be formed between the semiconductor and the metal to finely adjust the current characteristic.

For example, the P-type semiconductor layer is set to 5 nm, intrinsic semiconductor layer is set to about 60 nm, and the insulating layer is made of the extremely-thin (1 nm or less) SiN having the low barrier height. Therefore, even if the metal layer is set to 10 nm, because the sum of the layers becomes about 75 nm, the reverse current can be suppressed by the effect of the intrinsic semiconductor while the current is gained.

(d) Material Example

A concrete example for the resistance change memory in which the SMIS diode is used as the rectifying element will be described.

The p-type semiconductor layer and the n-type semiconductor layer, which constitute the SMIS diode, are selected from the group of Si, SiGe, SiC, Ge, C, GaAs, an oxide semiconductor, a nitride semiconductor, a carbide semiconductor, and a sulfide semiconductor.

Preferably, the p-type semiconductor layer (anode layer) is one of p-type Si, $TiO_2$, $ZrO_2$, $InZnO_X$, ITO, $SnO_2$ containing Sb, ZnO containing Al, $AgSbO_3$, $InGaZnO_4$, and $ZnO.SnO_2$.

Preferably, the n-type semiconductor layer (cathode layer) is one of n-type Si, $NiO_X$, ZnO, $Rh_2O_3$, ZnO containing N, and $La_2CuO_4$.

For example, the insulating layer constituting the SMIS diode is selected from the following materials.

A) Oxide $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, or a combination thereof.

$AB_2O_4$

Where A and B are identical or different elements and one of Al, Sc, Ti, V, Cr, Mn, Fe, Co, Ni, Cu, Zn, Ga, Ge, or a combination thereof.

For example, $Fe_3O_4$, $FeAl_2O_4$, $Mn_{1+x}Al_{2-x}O_{4+y}$, $Co_{1+x}Al_{2-x}O_{4+y}$, and $MnO_X$ $ABO_3$ Where A and B are identical or different elements and one of Ai, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, Sn, or a combination thereof.

For example, $LaAlO_3$, $SrHfO_3$, $SrZrO_3$, and $SrTiO_3$

B) Oxynitride

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON, or a combination thereof.

A material replaced some of the oxygen elements of the material in A) Oxide to a nitrogen element.

Particularly, the insulating layer constituting the SMIS diode is preferably selected from the group of $SiO_2$, SiN, $Si_3N_4$, $Al_2O_3$, SiON, $HfO_2$, HfSiON, $Ta_2O_5$, $TiO_2$, $SrTiO_3$, or a combination thereof.

Particularly, for the insulating layer made of an Si-based material such as $SiO_2$, SiN, and SiON, each of the oxygen element and the nitrogen element has a concentration of $1 \times 10^{18}$ atoms/cm$^3$ or more.

The insulating layer includes an insulating layer that contains an impurity atom or semiconductor/metal dot (quantum dot), which forms the defect level.

The conductive line that acts as the word line/bit line is made of W, WN, Al, Ti, V, Cr, Mn, Fe, Co, Ni, Cu, TiN, $WSi_X$, $TaSi_X$, $PdSi_X$, $ErSi_X$, $YSi_X$, $PtSi_X$, $HfSi_X$, $NiSi_X$, $CoSi_X$, $TiSi_X$, $VSi_X$, $CrSi_X$, $MhSi_X$, $FeSi_X$, or a combination thereof.

A single metal element or a mixture of metal elements, silicide, oxide, and nitride can be cited as an example of the material for the electrode layer. Specifically, the electrode layer is made of Pt, Au, Ag, TiAlN, SrRuO, Ru, RuN, Ir, Ti, V, Cr, Mn, Fe, Co, Ni, Cu, TiN, TaN, LaNiO, Al, $PtIrO_X$, $PtRhO_X$, Rh, TaAlN, $SiTiO_X$, $WSi_X$, $TaSi_X$, $PdSi_X$, $PtSi_X$, $IrSi_X$, $ErSi_X$, $YSi_X$, $HfSi_X$, $NiSi_X$, $CoSi_X$, $TiSi_X$, $VSi_X$, $CrSi_X$, $MnSi_X$, $FeSi_X$, or a combination thereof. The electrode layer may simultaneously have a function as a barrier metallic layer or a bonding layer.

However, the electrode layer includes a metallic layer constituting the SMIS diode (the electrode layer may also be used as the metallic layer).

The metallic layer constituting the SMIS diode is made of one of the following materials or a combination thereof:

A) A single metal element or a mixture of metal elements,

B) Compound metal that is an oxide, carbide, boride, nitride, or silicide, and

C) One or a combination of $TiN_x$, $TiC_x$, $TiB_x$, $TiSi_x$, $TaC_x$, $TaB_x$, $TaN_x$, $WC_x$, $WB_x$, W, $WSi_x$, $TaC_x$, TaB, $TaN_x$, $TaSi_x$, $LaB_x$, $LaN_x$, $LaSi_x$, $HfSi_x$, Hf, $YSi_x$, ErSi, NiSi, $NiSi_x$, $PtSi_x$, $PdSi_x$, $CoSi_x$, $MnSi_x$, $CrSi_x$, and $FeSi_x$.

For example, the memory element is made of a binary or ternary metal oxide or an organic material.

(e) Effect

In case of the SMIS diode is used as the rectifying element of the resistance change memory, the thickness of the rectifying element can be decreased to ⅓ to ⅕ that of the p-n junction diode and the p-i-n diode while the rectifying characteristic is maintained. In other words, in case of the SMIS diode is set to the same thickness as the p-n junction diode or the p-i-n diode, the reverse current of the SMIS diode to which the reverse bias is applied decreases $10^3$ or more compared with the p-n junction diode or the p-i-n diode, to which the identical reverse bias is applied.

Accordingly, a reduction of the power consumption of the resistance change memory, improvement in the operating speed, and ease of read can be realized.

One of the anode layer and cathode layer of the SMIS diode is made of a metal while the other is made of a semiconductor, so that the rectifying characteristic can be controlled by adjusting the effective work function (Fermi level) of the metal and the Fermi level of the semiconductor.

Particularly, in case of the cathode layer is made of a metal, in the forward bias, the Fermi level of the metallic layer on the electron-injection side is relatively raised, and the Fermi level of the p-type semiconductor layer on the electron-reception side is relatively lowered, which allows the rectifying characteristic to be enhanced.

Particularly, in case of the anode layer is made of a metal, in the forward bias, the Fermi level of the metallic layer on the electron-injection side is relatively raised, and the Fermi level of the n-type semiconductor layer on the electron-reception side is relatively lowered, which allows the rectifying characteristic to be enhanced.

In the p-i-n diode, in case of the minimum line width becomes 30 nm or less, unfortunately a variation in characteristic is generated by a variation in impurity concentration of the semiconductor layer. On the other hand, in the SMIS diode, the variation in characteristic is reduced because one of the anode layer and the cathode layer is made of a metal.

In the SMIS diode, consider one (metallic layer side) of the anode layer and the cathode layer is only considered for the depletion of the semiconductor layer, which contributes to a thinned diode.

In the SMIS diode, because the Schottky barrier is formed by bringing the semiconductor layer and the metallic layer into contact with each other, the rectifying characteristic of the Schottky diode can be added to the rectifying characteristic of the MIS diode. Therefore, the rectifying characteristic of the SMIS diode can also be controlled by the impurity concentration of the semiconductor layer that is in contact with the metallic layer.

The SMIS diode comprises plural insulating layers, and the insulating layers differ from each other in the barrier height or the permittivity. Therefore, the on/off-ratio of the SMIS diode can be improved by the different barrier heights or permittivities of the insulating layers and the impurity concentrations of the p-type semiconductor layer and n-type semiconductor layer.

The on/off-ratio can also be improved by incorporating the trap level (a dot or a defect of an impurity or Si) in the single or plural insulating films asymmetrically.

Ultimately the forward current can be significantly improved by extremely thinning the insulating film. Actually, the current characteristic can be improved by the use of an extremely-thin insulating film made of $SiO_x$, $SiN_x$, $TiO_x$, $NiO_x$, $WO_x$, and the like, which are formed by natural oxidation or SPA.

E. MIM Diode (a) Structure

Figure 46:
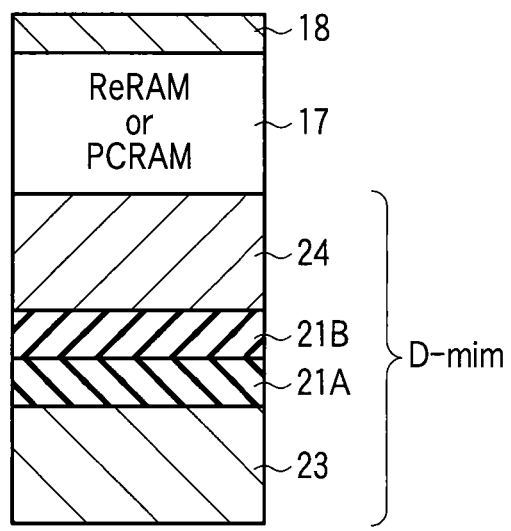
FIG. 46 illustrates a device structure of an MIM diode.

FIG. 46 illustrates a structure of an MIM diode.

MIM diode D-mim has a stacked structure of metallic layer 23, insulating layers 21A and 21B, and metallic layer 24.

The positional relationship between the memory element and the rectifying element and the structures of the memory element and the rectifying element may be changed in various ways as long as the rectifying characteristic of the rectifying element is not lost. For example, the memory element and the rectifying element may be formed upside down, the cathode and anode of the rectifying element may be reversed, the electrode layer may be omitted or added, a barrier layer that suppresses diffusion of the impurity may be added, or a combination thereof may be performed.

The memory function of utilizing the insulating characteristic change caused by a trap or ion movement may be added to the insulating layer constituting the MIM diode.

The barrier height (or electron affinity) of the material for insulating layer 21A differs from the barrier height (or electron affinity) of the material for insulating layer 21B. For example, the barrier height of the material for insulating layer 21A is higher than that of the material for insulating layer 21B.

Preferably, metallic layers 23 and 24 have different effective work functions. For example, when the barrier height of the material for insulating layer 21A is higher than that of the material for insulating layer 21B, the effective work function of metallic layer 23 is set larger than that of metallic layer 24.

At this point, the Fermi level of metallic layer 23 is lower than that of metallic layer 24.

Memory element 17 which is the variable resistive element (ReRAM) or the phase-change element (PCRAM) is disposed on MIM diode D-mim, and electrode layer 18 is disposed on memory element 17.

One of the features of MIM diode D-mim is that the reverse current caused by the reverse bias can be sufficiently suppressed during the set/reset operation even if the thickness in the third direction of MIM diode D-mim is set to 100 nm or less.

For example, the thickness in the third direction of MIM diode D-mim is set to the range of 10 nm to 30 nm. For example, metallic layer 23 is set to 10 nm, the sum of thickness of insulating layers 21A and 21B is set to 1 nm, and metallic layer 24 is set to 10 nm, whereby the thickness of MIM diode D-mim becomes 21 nm.

The thickness of insulating layers 21A and 21B is determined based on the condition that the charge tunneling phenomenon (including both direct tunneling and FN tunneling) is generated between two metallic layers 23 and 24. For example, the sum of thickness of insulating layers 21A and 21B is set to the range of 0.5 to 3 nm.

Insulating layers 21A and 21B may include an impurity atom or semiconductor/metal dot (quantum dot), which forms the defect level. A fine rectifying element (non-ohmic element) that can be formed at a low temperature can be shrunk by the above structure.

The number of insulating layers constituting the MIM diode is not limited to two, and the MIM diode may include at least three insulating layers. As illustrated in FIG. 50, three insulating layers, 21A, 21B, and 21C may be disposed between two metallic layers 23 and 24.

Preferably, three insulating layers 21A, 21B, and 21C have different barrier heights.

(b) Operation Mechanism

An operation mechanism of the MIM diode will be described by taking the structure of FIG. 46 as an example.

Figure 47:
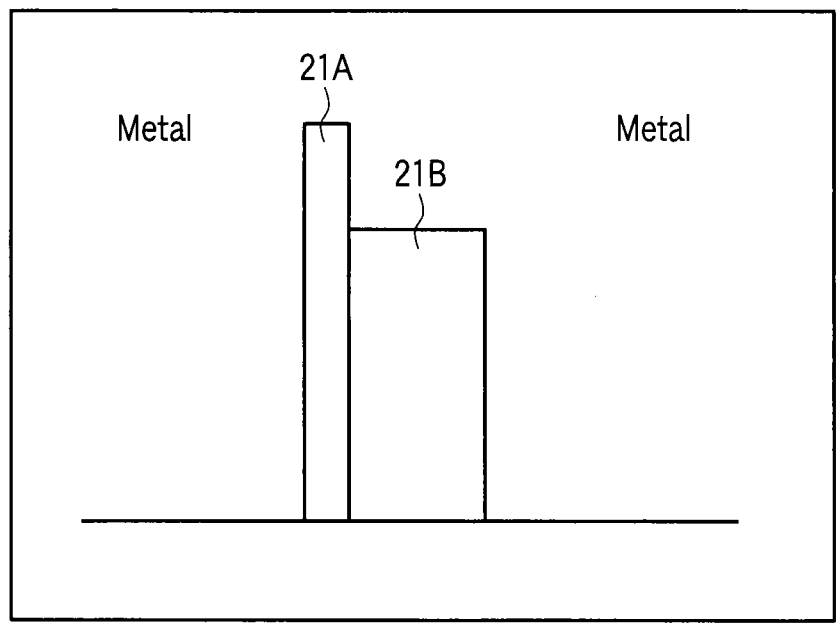
FIG. 47 illustrates a band structure.

FIG. 47 illustrates a band structure of the MIM diode.

While the bias is not applied, the barrier height of insulating layer 21A is higher than that of insulating layer 21B. For example, insulating layer 21A is made of $SiO_2$ having a thickness of 0.5 nm, and insulating layer 21B is made of $TiO_2$ having a thickness of 1 nm.

In case of the forward bias is applied to the MIM diode, as illustrated in FIG. 48, because electrons are only influenced by the thickness of insulating layer 21A, charge movement is generated by the FN tunneling of insulating layer 21A, and the current passed through the MIM diode increases with increasing forward bias.

On the other hand, in case of the reverse bias is applied to the MIM diode, as illustrated in FIG. 49, because electrons are influenced by the sum of thickness of insulating layers 21A and 21B, there is no tunneling of the carrier through insulating layers 21A and 21B, and the current is not passed through the MIM diode.

For this example, the reverse current of the MIM diode can be sufficiently suppressed against the reverse bias. At the same time, a sufficiently large forward current (set/reset current) can be obtained with respect to the forward bias.

An example of a structure of FIG. 50 will be described.

FIG. 51 illustrates a band structure of the MIM diode.

While the bias is not applied, insulating layers 21A, 21B, and 21C differ from one another in the barrier height. For example, insulating layer 21A is made of $SiO_2$ having a thickness of 0.5 nm, insulating layer 21B is made of $TiO_2$ having a thickness of 1 nm, and insulating layer 21C is made of SiN having a thickness of 0.5 nm.

In case of the forward bias is applied to the MIM diode, as illustrated in FIG. 52, because electrons are only influenced by the thickness of insulating layer 21A, charge movement is generated by the FN tunneling of insulating layer 21A, and the current passed through the MIM diode increases with increasing forward bias.

Figure 53:
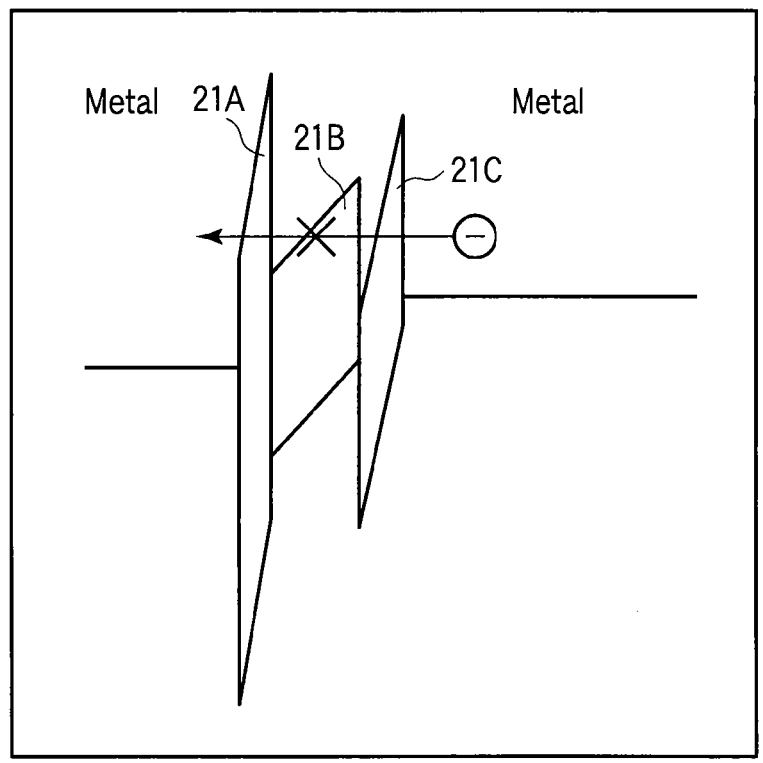
FIG. 53 illustrates an operation during a reverse bias.

On the other hand, in case of the reverse bias is applied to the MIM diode, as illustrated in FIG. 53, because electrons are influenced by the sum of thickness of the insulating layers 21A, 21B, and 21C, the carrier is not tunneling through insulating layers 21A, 21B, and 21C, and the current is not passed through the MIM diode.

For this example, the reverse current of the MIM diode can be sufficiently suppressed against the reverse bias. At the same time, a sufficiently large forward current (set/reset current) can be obtained with respect to the forward bias.

(c) Embodiments

Figure 54:
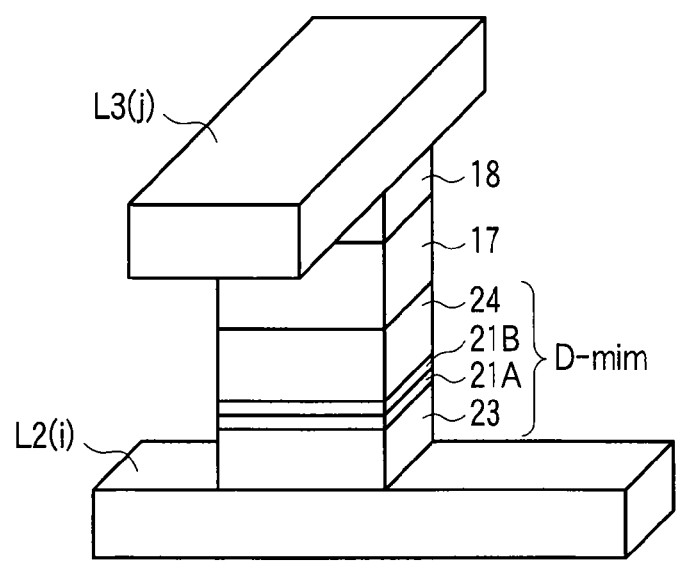
FIG. 54 illustrates an embodiment.

FIG. 54 illustrates a structure of the MIM diode.

The structure corresponds to the MIM diode of FIG. 46.

Metallic layer (electrode layer) 23, insulating layers 21A and 21B, and metallic layer (electrode layer) 24 are stacked on conductive line L2(i) extended in the first direction. MIM diode D-mim comprises metallic layer 23, insulating layers 21A and 21B, and metallic layer 24.

Memory element 17 which is the variable resistive element or the phase-change element and electrode layer 18 are stacked on MIM diode D-mim. Conductive line L3(j) is disposed on electrode layer 18, and extended in the second direction intersecting the first direction. That is, electrode layer 12 and electrode layer 16 of FIG. 10 are used as metallic layer 23 and metallic layer 24 of the MIM diode. As a result, the height of memory cell MC can be further decreased.

In MIM diode D-mim, in order to realize the set/reset operation, the reverse current of the MIM diode should be sufficiently suppressed to the reverse bias applied during the set/reset operation.

Therefore, the thickness in the third direction of MIM diode D-mim is set to the range of 10 nm to 30 nm. For example, metallic layer 23 is set to 10 nm, the sum of thickness of insulating layer 21A and 21B is set to 1 nm, and metallic layer 24 is set to 10 nm, whereby the thickness of MIM diode D-mim becomes 21 nm.

(d) Material Example

A material example for the resistance change memory in which the MIM diode is used as the rectifying element will be described.

The insulating layers constituting the MIM diode are selected from the following materials.

A) Oxide $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, or a combination thereof.

$AB_2O_4$

Where A and B are identical or different elements and one of Al, Sc, Ti, V, Cr, Mn, Fe, Co, Ni, Cu, Zn, Ga, Ge, or a combination thereof.

For example, $Fe_3O_4$, $FeAl_2O_4$, $Mn_{1+x}Al_{2-x}O_{4+y}$, $Co_{1+x}Al_{2-x}O_{4+y}$, and $MnO_x$ $ABO_3$ Where A and B are identical or different elements and one of Ai, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, Sn, or a combination thereof.

For example, $LaAlO_3$, $SrHfO_3$, $SrZrO_3$, and $SrTiO_3$

B) Oxynitride

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON, or a combination thereof.

A material replaced some of the oxygen elements of the material in A) Oxide to a nitrogen element.

Particularly, the insulating layer constituting the MIM diode is preferably selected from the group of $SiO_2$, SiN, $Si_3N_4$, $Al_2O_3$, SiON, $HfO_2$, HfSiON, $Ta_2O_5$, $TiO_2$, $SrTiO_3$, or a combination thereof.

Particularly, for the insulating layer made of an Si-based material such as $SiO_2$, SiN, and SiON, each of the oxygen element and the nitrogen element has a concentration of $1 \times 10^{18}$ atoms/cm$^3$ or more.

However, preferably the insulating layers have barrier heights that are different from one another.

The insulating layer includes a material that contains an impurity atom or semiconductor/metal dot (quantum dot), which forms the defect level.

The conductive line that acts as the word line/bit line is made of W, WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MhSi_x$, $FeSi_x$, or a combination thereof.

A single metal element or a mixture of metal elements, silicide, oxide, and nitride can be cited as an example of the material for the electrode layer. Specifically, the electrode layer is made of Pt, Au, Ag, TiAlN, SrRuO, Ru, RuN, Ir, Ti, V, Cr, Mn, Fe, Co, Ni, Cu, TiN, TaN, LaNiO, Al, $PtIrO_x$, $PtRhO_x$, Rh, TaAlN, $SiTiO_x$, $WSi_x$, $TaSi_x$, $PdSi_x$, $PtSi_x$, $IrSi_x$, $ErSi_x$, $YSi_x$, $HfSi_x$, $NiSi_x$, $CoSi_x$, $TiSi_x$, $VSi_x$, $CrSi_x$, $MnSi_x$, $FeSi_x$, or a combination thereof. The electrode layer may simultaneously have a function as a barrier metallic layer or a bonding layer.

However, the electrode layer includes the metallic layer constituting the MIM diode (the electrode layer may also be used as the metallic layer).

The two metallic layers constituting the MIM diode are made of one of the following materials:

A) A single metal element,

B) Compound metal that is an oxide, carbide, boride, nitride or silicide, and

C) $TiN_x$, $TiC_x$, $TiB_x$, $TiSi_x$, $TaC_x$, $TaB_x$, $TaN_x$, $WC_x$, $WB_x$, W, $WSi_x$, $TaC_x$, $TaB_x$, $TaN_x$, $TaSi_x$, $HfSi_x$, Hf, $YSi_x$, $ErSi_x$.

However, the two metallic layers have different effective work functions.

For example, when one of the two metallic layers is made of a material selected from one of $ErSi_x$, $HfSi_x$, $YSi_x$, $TaC_x$, $TaN_x$, $TiN_x$, $TiC_x$, $TiB_x$, $LaB_x$, La, $LaN_x$, or a combination thereof which have a small effective work function, preferably the other is made of a material selected from one of $WN_x$, W, $WB_x$, $WC_x$, Pt, $PtSi_x$, Pd, $PdSi_x$, Ir, and $IrSi_x$, or a combination thereof which have a large effective work function.

For example, the memory element is made of a binary or ternary metal oxide.

(e) Effect

In case of the MIM diode is used as the rectifying element of the resistance change memory, the thickness of the rectifying element can be decreased to ⅕ to 1/10 that of the p-n junction diode and the p-i-n diode while the rectifying characteristic is maintained. In other words, in case of the MIM diode is set to the same thickness as the p-n junction diode or the p-i-n diode, the reverse current of the MIS diode to which the reverse bias is applied decreases $10^3$ or more compared with the p-n junction diode or p-i-n diode, to which an identical reverse bias is applied.

Accordingly, a reduction of the power consumption of the resistance change memory, improvement in the operating speed, and ease of read can be realized.

Both the anode layer and cathode layer of the MIM diode are made of a metal, so that the rectifying characteristic can be controlled by adjusting the effective work function (Fermi level) of the metal.

In the p-i-n diode, when the minimum line width becomes 30 nm or less, unfortunately a variation in characteristic is generated by the variation in impurity concentration of the semiconductor layer. On the other hand, in the MIM diode, the variation in characteristic is reduced because both the anode layer and the cathode layer are made of a metal.

In the MIM diode, the depletion of the semiconductor layer is not considered, which contributes to a thinned diode.

The MIM diode comprises plural insulating layers, and the insulating layers differ from each other in the barrier height or the permittivity. Therefore, the on/off-ratio of the MIS diode can be improved by the different barrier heights or permittivities of the insulating layers.

The on/off-ratio can also be improved by incorporating the trap level (a dot or a defect of an impurity or Si) in the single or plural insulating films asymmetrically.

Ultimately, the forward current can be significantly improved by extremely thinning the insulating film. In practice, the current characteristic can be improved by the use of an extremely-thin insulating film made of $SiO_x$, $SiN_x$, $TiO_x$, $NiO_x$, $WO_x$, and the like, which are formed by natural oxidation or SPA.

3. Application Example

The resistance change memory of the embodiment has a high potential as a next-generation universal memory that replaces the current memories, such as the magnetic memory, the NAND flash memory, and the dynamic random access memory, which are used in commercially available products.

Therefore, for example, the invention may be applied to a file memory in which the data can randomly be written at high speed, a mobile terminal that can download data at high speed, a portable player that can download data at high speed, a semiconductor memory for broadcasting equipment, a drive recorder, a home video, a large-capacity buffer memory for communication, and a semiconductor memory for a security camera.

4. Conclusion

According to the invention, the rectifying element can be sufficiently thinned while satisfying the rectifying element characteristic required for the resistance change memory. The resistance change memory of the invention has a large advantage as a next-generation universal memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistance change memory comprising:
a first conductive line extending in a first direction;
a second conductive line extending in a second direction which is crossed to the first direction;
a cell unit including a memory element and a rectifying element connected in series between the first and second conductive lines; and
a control circuit which is connected to both of the first and second conductive lines,
wherein the control circuit is configured to control a voltage to change a resistance of the memory element between first and second values reversibly,
wherein the rectifying element is a diode including a metal layer, an insulating layer, a first semiconductor layer and an intrinsic semiconductor layer,
wherein the intrinsic semiconductor layer is sandwiched between the insulating layer and the first semiconductor layer,
wherein the insulating layer is sandwiched between the metal layer and the intrinsic semiconductor layer, and
wherein the first semiconductor layer is sandwiched between the intrinsic semiconductor layer and an electrode layer.

2. The memory according to claim 1, wherein the insulating layer is one selected from the group of $SiO_2$, SiN, $Si_3N_4$, $Al_2O_3$, SiON, $HfO_2$, HfSiON, $Ta_2O_5$, $TiO_2$, and $SrTiO_3$.

3. The memory according to claim 1, wherein the insulating layer includes one of an impurity atom, a semiconductor dot, and a metal dot, which form a defect level.

4. The memory according to claim 1, wherein the first semiconductor layer is one selected from the group of Si, SiGe, SiC, Ge, C, GaAs, oxide semiconductor, nitride semiconductor, carbide semiconductor, and sulfide semiconductor.

5. The memory according to claim 1, wherein when the first semiconductor layer is an anode layer, the anode layer is one of p-type Si, $TiO_2$, $ZrO_2$, $InZnO_x$, ITO, $SnO_2$ containing Sb, ZnO containing Al, $AgSbO_3$, $InGaZnO_4$, and $ZnO.SnO_2$, and when the first semiconductor layer is a cathode layer, the cathode layer is one of n-type Si, $NiO_x$, ZnO, $Rh_2O_3$, ZnO containing N, and $La_2CuO_4$, wherein the suffix x indicates any composition ratio.

6. The memory according to claim 1, wherein the metal layer is made of one of A) a single element, B) compound metal that is an oxide, carbide, boride, nitride, or silicide, and C) one or a combination of $TiN_x$, $TiC_x$, $TiB_x$, $TiSi_x$, $TaC_x$, $Ta_x$, $TaN_x$, $WC_x$, $WB_x$, W, $WSi_x$, $TaC_x$, TaB, $TaN_x$, $TaSi_x$, $LaB_x$, $LaN_x$, $LaSi_x$, $HfSi_x$, Hf, $YSi_x$, $ErSi_x$, NiSi, $NiSi_x$, $PtSi_x$, $PdSi_x$, $CoSi_x$, $MnSi_x$, $CrSi_x$, and $FeSi_x$, wherein the suffix x indicates any composition ratio.

7. A resistance change memory comprising:
a first conductive line extending in a first direction;
a second conductive line extending in a second direction which is crossed to the first direction;
a cell unit including a memory element and a rectifying element connected in series between the first and second conductive lines; and
a control circuit which is connected to both of the first and second conductive lines,
wherein the control circuit is configured to control a voltage to change a resistance of the memory element between first and second values reversibly,
wherein the rectifying element is a diode including a metal layer, an insulating layer, a first semiconductor layer, a second semiconductor layer, an intrinsic semiconductor layer, wherein the metal layer, the insulating layer, and the intrinsic layer are sandwiched between the first semiconductor layer and the second semiconductor layer, and wherein the insulating layer is sandwiched between the metal layer and the intrinsic semiconductor layer.

8. The memory according to claim 7, wherein the insulating layer is one selected from the group of $SiO_2$, $SiN$, $Si_3N_4$, $Al_2O_3$, $SiON$, $HfO_2$, $HfSiON$, $Ta_2O_5$, $TiO_2$, and $SrTiO_3$.

9. The memory according to claim 7, wherein the insulating layer includes one of an impurity atom, a semiconductor dot, and a metal dot, which form a defect level.

10. The memory according to claim 7, wherein the metal layer is made of one of A) a single element, B) compound metal that is an oxide, carbide, boride, nitride, or silicide, and C) one or a combination of $TiN_x$, $TiC_x$, $TiB_x$, $TiSi_x$, $TaC_x$, $TaB_x$, $TaN_x$, $WC_x$, $WB_x$, $W$, $WSi_x$, $TaC_x$, $TaB$, $TaN_x$, $TaSi_x$, $LaB_x$, $LaN_x$, $LaSi_x$, $HfSi_x$, $Hf$, $YSi_x$, $ErSi_x$, $NiSi$, $NiSi_x$, $PtSi_x$, $PdSi_x$, $CoSi_x$, $MnSi_x$, $CrSi_x$, and $FeSi_x$, wherein the suffix x indicates any composition ratio.

* * * * *